US012726201B2

(12) United States Patent
Bowers et al.

(10) Patent No.: US 12,726,201 B2
(45) Date of Patent: Sep. 1, 2026

(54) OPTICAL CIRCUIT AND METHOD THEREOF

(71) Applicants: University of Southern California, Los Angeles, CA (US); The Regents of the University of California, Oakland, CA (US)

(72) Inventors: John Bowers, Santa Barbara, CA (US); Sujith Chandran, Los Angeles, CA (US); Yeshaiahu Fainman, San Diego, CA (US); Michael Haney, Los Angeles, CA (US); Ajey P. Jacob, Watervliet, NY (US); Sugeet Sunder, Los Angeles, CA (US)

(73) Assignees: University of Southern California, Los Angeles, CA (US); The Regents of the University of California, Oakland, CA (US)

( * ) Notice: Subject to any disclaimer, the term of this patent is extended or adjusted under 35 U.S.C. 154(b) by 69 days.

(21) Appl. No.: 18/986,244

(22) Filed: Dec. 18, 2024

(65) Prior Publication Data

US 2025/0211234 A1 Jun. 26, 2025

Related U.S. Application Data

(60) Provisional application No. 63/612,765, filed on Dec. 20, 2023.

(51) Int. Cl.

| | |
|---|---|
| ***H03K 19/14*** | (2006.01) |
| ***G02B 6/293*** | (2006.01) |
| ***G02F 1/35*** | (2006.01) |

(52) U.S. Cl.

CPC ......... *H03K 19/14* (2013.01); *G02B 6/29338* (2013.01); *G02F 1/3507* (2021.01); *G02F 1/3509* (2021.01); *G02F 1/3517* (2013.01)

(58) Field of Classification Search

CPC .. H03K 19/14; G02B 6/29338; G02F 1/3507; G02F 1/3509; G02F 1/3517; G02F 3/00

See application file for complete search history.

(56) References Cited

U.S. PATENT DOCUMENTS

| | | | | |
|---|---|---|---|---|
| 7,409,131 B2 * | 8/2008 | Covey | ..................... | G02F 3/024 385/129 |
| 2022/0365284 A1 * | 11/2022 | Song | .................. | G02B 6/29338 |

OTHER PUBLICATIONS

"Energy Consumption of ICT," (2022) UK Parliament Post, Post Note No. 677.

(Continued)

*Primary Examiner* — Tony Ko

(74) *Attorney, Agent, or Firm* — Foley & Lardner LLP

(57) ABSTRACT

An optical circuit includes a resonator including a nonlinear optical material having intensity-dependent absorption, an input, and an output. The optical circuit includes an optical input path coupled to the input of the resonator and provides an optical logic input, an optical reference path coherently coupled to the resonator and configured to provide a first reference signal coupled to the optical input path and a second reference signal, and an optical output path coupled to the output of the resonator and configured to receive the second reference signal. The resonator receives a combined version of the optical logic input and the first reference signal, and provides an optical output signal based on the optical logic input, the first reference signal, and an intensity threshold of the nonlinear optical material. The optical output path provides an optical logic output corresponding to an output logic state based on the optical output signal and the second reference signal. The coherent coupling of the optical reference path to the resonator is configured to provide optical gain.

20 Claims, 23 Drawing Sheets

(56) References Cited

OTHER PUBLICATIONS

Cole C., "Optical and electrical programmable computing energy use comparison," (2021) Optics Express vol. 29, No. 9, pp. 13153-13170.

Fang et al., "A distributed feedback silicon evanescent laser," (2008) University of California, Santa Barbara, Department of Electrical and Computer Engineering, Santa Barbara, CA 93106, Optical Society of America OCIS codes: (140.5960) Semiconductor lasers; (250.5300) Photonic integrated circuits, pp. 4413-4419.

Freitag et al., "The real climate and transformative impact of ICT: A critique of estimates, trends, and regulations," (2021) Cell Press Patterns https://doi.org/10.1016/j.patter.2021.100340.

Kurczveil et al., "Robust hybrid quantum dot laser for integrated silicon photonics," (2016) Optics Express vol. 24, No. 14, pp. 16167-16174.

L.S., "The end of Moore's law," (2015) The Economist https://www.economist.com/the-economist-explains/2015/04/19/the-end-of-moores-law.

Li et al, "The challenges of modern computing and new opportunities for optics," (2021) Photonix 2:20 https://doi.org/10.1186/s43074-021-00042-0.

Luo et al., "Cascadable all-optical NAND gates using diffractive networks," (2022) Scientific Reports 12.7121 https://doi.org/10.1038/s41598-022-11331-4.

Miller, D. (2010) Nature Photonics vol. 4, p. 406.

Okuda et al. "Transient Behavior of a Saturable Optical Resonator with Distributed Bragg-Reflectors," (1978) Japanese Journal of Applied Physics, vol. 17, No. 12, pp. 2123-2128.

Shalf et al., "The future of computing beyond Moore's Law," (2020) Philosophical Transactions Royal Society A 378: 20190061.http://dx.doi.org/10.1098/rsta.2019.0061.

Sludds et al, "Delocalized photonic deep learning on the internet's edge" and Supplementary Materials (2022) Science 378.

Strubell et al., "Energy and Policy Considerations for Deep Learning in NLP," (2019) College of Information and Computer Sciences University of Massachusetts Amherst arXiv:1906.02243v1 [cs.CL].

Willner et al., "All Optical Signal Processing," (2014) Journal of Lightwave Technology vol. 32, No. 4, pp. 660-680.

* cited by examiner

| $\phi_1$ | $\phi_2$ | $E_{in}$ | C |
|---|---|---|---|
| 0 | 0 | H | $\frac{Q}{\sqrt{2}}$ |
| 0 | π | $L_1$ | $-\frac{Q}{\sqrt{2}}$ |
| π | 0 | $L_1$ | $-\frac{Q}{\sqrt{2}}$ |
| π | π | $L_2$ | $-\frac{Q}{\sqrt{2}}$ |

| $\phi_1$ | $\phi_2$ | $E_{in}$ | C |
|---|---|---|---|
| 0 | 0 | $H_1$ | $> \frac{Q}{\sqrt{2}}$ |
| 0 | π | $H_2$ | $\frac{Q}{\sqrt{2}}$ |
| π | 0 | $H_2$ | $\frac{Q}{\sqrt{2}}$ |
| π | π | L | $-\frac{Q}{\sqrt{2}}$ |

| $Pe^{j\phi_P}$ | | $D_1e^{j\phi_{D1}}$ | | $D_2e^{j\phi_{D2}}$ | | $P'e^{j\phi_{P'}}$ | | $Ce^{j\phi_C}$ | |
|---|---|---|---|---|---|---|---|---|---|
| $P$ | $\phi_P$ | $D_1$ | $\phi_{D1}$ | $D_2$ | $\phi_{D2}$ | $P'$ | $\phi_{P'}$ | $C$ | $\phi_C$ |
| 2.7 | 0 | 0.4 | 0 | 0.4 | 0 | 0.97 | $\pi$ | 0.57 | 0 |
| 2.7 | 0 | 0.4 | 0 | 0.4 | $\pi$ | 0.97 | $\pi$ | 0.57 | $\pi$ |
| 2.7 | 0 | 0.4 | $\pi$ | 0.4 | 0 | 0.97 | $\pi$ | 0.57 | $\pi$ |
| 2.7 | 0 | 0.4 | $\pi$ | 0.4 | $\pi$ | 0.97 | $\pi$ | 0.63 | $\pi$ |

FIG. 11

| $\phi_S$ | $\phi_R$ | $\phi_Q$ |
|---|---|---|
| 0 | 0 | No change |
| π | 0 | π |
| 0 | π | 0 |

OPTICAL CIRCUIT AND METHOD THEREOF

CROSS-REFERENCE TO RELATED PATENT APPLICATIONS

This application claims priority to and the benefit of U.S. Provisional Application No. 63/612,765, filed Dec. 20, 2023, entitled "Photonic Absorption, Saturation, Thresholding (PhAST) Gate," which is incorporated herein by reference in its entirety for all purposes.

BACKGROUND

The following description is provided to assist the understanding of the reader. None of the information provided or references cited is admitted to be prior art.

Digital circuits process electrical signals with discrete logic levels, typically "0" and "1," but their power consumption increases with speed. In contrast, optical processing, which manipulates information directly in the optical domain, offers the potential for reduced power consumption and higher speed by avoiding the need for electrical conversions. Advancements like optical digital signal processors aim to enable efficient, high-speed information processing by leveraging the inherent advantages of optical systems, such as low latency and high bandwidth.

SUMMARY OF THE INVENTION

Certain embodiments of the present disclosure relate to optical circuits and methods thereof.

An aspect of the disclosure is directed to an optical circuit. The optical circuit includes a resonator including a nonlinear optical material having intensity-dependent absorption, an input, and an output, an optical input path coupled to the input of the resonator and configured to provide an optical logic input, an optical reference path coherently coupled to the input and the output of the resonator and configured to provide a first reference signal coupled to the optical input path and a second reference signal, and an optical output path coupled to the output of the resonator and configured to receive the second reference signal. The resonator is configured to receive a combined version of the optical logic input and the first reference signal, and provide an optical output signal based on the optical logic input, the first reference signal, and an intensity threshold of the nonlinear optical material. The optical output path is configured to provide an optical logic output based on the optical output signal and the second reference signal, the optical logic output corresponding to an output logic state. The coherent coupling of the optical reference path to the resonator is configured to provide optical gain.

In some embodiments, the optical circuit includes a first optical coupler configured to combine the optical logic input with the first optical reference signal and generate an optical input signal coupled to the input of the resonator, and a second optical coupler configured to combine the optical output signal with the second reference signal to generate the optical logic output. In some embodiments, the input of the resonator is configured to receive an optical input signal that includes the optical logic input and the first optical reference signal. The nonlinear optical material is configured to transmit the optical input signal as the optical output signal in response to the optical input signal exceeding the intensity threshold, and absorb the optical input signal to not transmit the optical output signal in response to the optical input signal being below the intensity threshold. In some embodiments, the optical input path is operatively coupled with a plurality of logic inputs, and the optical logic input is generated based on the plurality of logic inputs. In some embodiments, the plurality of logic inputs are optical signals, and at least one of the plurality of logic inputs is a substantially-zero input serving as a logic state. In some embodiments, the resonator is one of: an optical cavity, an optical ring resonator, and a Fabry-Perot resonator. In some embodiments, the nonlinear optical material is disposed on a top surface of the resonator or within a trench of the resonator and includes at least one of a multi-quantum well and quantum dots. In some embodiments, the optical circuit is configured to perform one of operations: AND, OR, NOT, NAND, NOR, XOR, XNOR, flip flop, modulation, and demodulation with the optical input path serving as an input and the optical output path serving as an output. The output logic state is a result of the one of operations determined based on a phase or an amplitude of the optical logic output. In some embodiments, the resonator is a first resonator, and the optical circuit further includes a second resonator optically coupled with the first resonator in series or parallel. In some embodiments, the optical circuit includes a fanout component optically coupled to the output of the resonator and configured to provide the optical logic output to a plurality of fanout paths.

Another aspect of the disclosure is directed to an optical circuit. The optical circuit includes an optical input path configured to provide an optical logic input, a first optical coupler configured to combine the optical logic input with a first optical reference signal and generate an optical input signal, and an optical resonator configured to receive the optical input signal, and further configured to provide a first optical output signal in response to the optical input signal exceeding an intensity threshold, or provide a second optical output signal in response to the optical input signal being below the intensity threshold. The optical circuit includes a second optical coupler configured to combine one of (i) the first optical output signal and (ii) the second optical output signal with a second reference signal to generate an optical logic output corresponding to (i) a first logic state associated with the first optical output signal or (ii) a second logic state associated with the second optical output signal. Each of the first optical reference signal and the second optical reference signal allows for interferometric gain.

In some embodiments, the optical resonator includes a nonlinear optical material configured to transmit the optical input signal to provide the first optical output signal in response to the optical input signal exceeding the intensity threshold, and absorb the optical input signal to provide the second optical output signal in response to the optical input signal being below the intensity threshold. In some embodiments, the nonlinear optical material is disposed on a top surface of the optical resonator or within a trench of the optical resonator and includes at least one of a multi-quantum well and quantum dots. In some embodiments, the optical input path is operatively coupled with a plurality of logic inputs, and the optical logic input is generated based on the plurality of logic inputs. In some embodiments, the plurality of logic inputs are optical signals, and at least one of the plurality of logic inputs is a substantially-zero input serving as a logic state. In some embodiments, the resonator is a first resonator, and the optical circuit further includes a second resonator wherein an output of the first resonator is optically coupled with an input or an output of the second resonator. In some embodiments, the optical circuit includes a fanout component configured to provide the optical logic output to a plurality of fanout paths.

Another aspect of the disclosure is directed to a method. The method includes providing an optical logic input generated based on a plurality of logic inputs, combining the optical logic input with a first reference signal to generate an optical input signal, receiving, by a resonator including a nonlinear optical material, the optical input signal, providing, by the resonator, an optical output signal based on the optical input signal and an intensity threshold of the nonlinear optical material, and combining the optical output signal with a second reference signal to generate an optical logic output corresponding to an output logic state.

In some embodiments, the method includes performing, based at least on the resonator, one of operations: AND, OR, NOT, NAND, NOR, XOR, XNOR, flip flop, modulation, and demodulation with the optical logic input serving as an input and the optical logic output serving as an output. In some embodiments, the method includes coupling the optical logic output with an input or an output of a second resonator.

Various aspects, embodiments, advantages, etc. of the present disclosure, as well as details of illustrated embodiments thereof, will be more understood from the following description and drawings.

BRIEF DESCRIPTION OF THE DRAWINGS

The drawings are of illustrative embodiments. They do not illustrate all embodiments. Other embodiments can be used in addition or instead. Details that can be apparent or unnecessary can be omitted to save space or for more effective illustration. Some embodiments can be practiced with additional components or steps and/or without all of the components or steps that are illustrated. When the same numeral appears in different drawings, it refers to the same or like components or steps.

FIG. 11 illustrates an example truth table associated with an optical circuit, in accordance with various embodiments.

DETAILED DESCRIPTION

Figure 1:
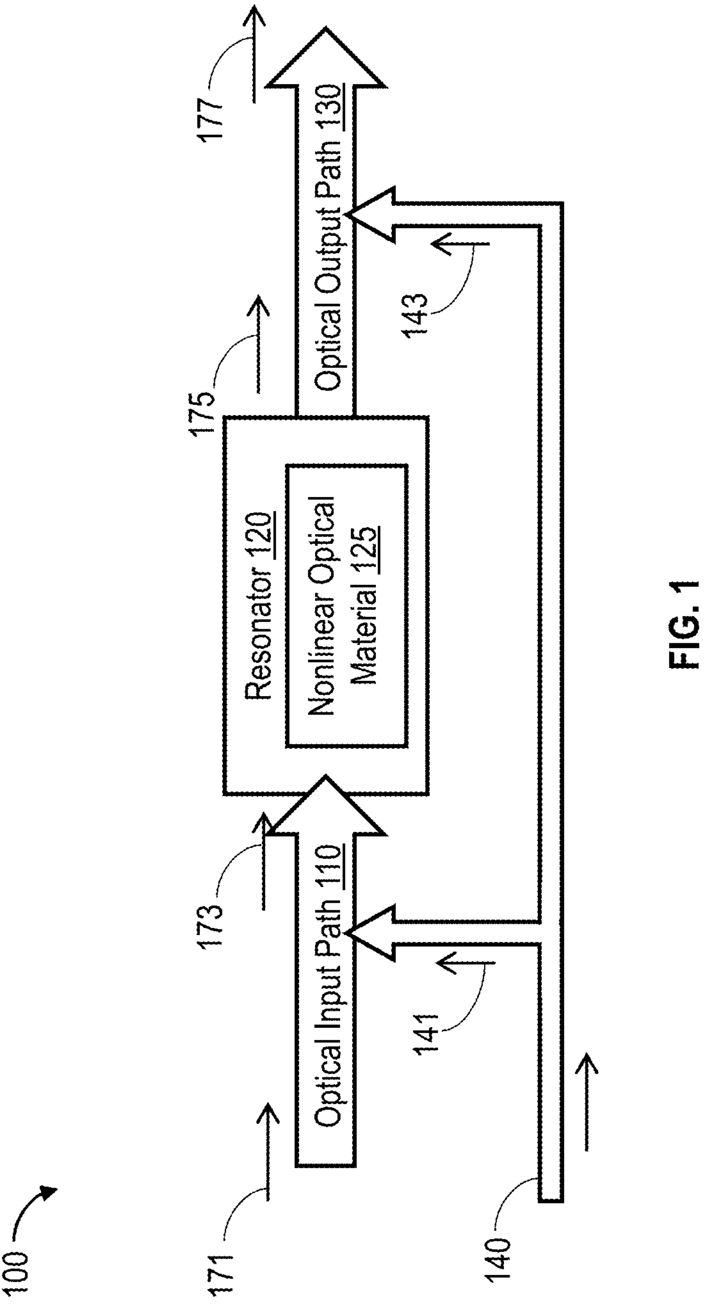
FIG. 1 illustrates a block diagram of an example optical circuit (e.g., an PhAST-Gate), in accordance with various embodiments.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments can be utilized, and other changes can be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

The Information and Communications Technology (ICT) sector accounted for an estimated 4 to 6% of global electricity consumption and 2 to 3% of the global carbon footprint. While projections vary, ICT's carbon footprint growth rate is estimated to be roughly double that of global greenhouse gas (GHG) emissions. The approximately 50 years of exponential efficiency improvements in silicon electronic computing, driven by Moore's Law, have helped mitigate these impacts. However, ICT plays an increasingly critical role across all economic sectors, powering advancements in areas such as transportation efficiency, drug and material discovery, robotic control, machinery and reactor design, agricultural optimization, environmental impact reduction, and refined climate modeling. Furthermore, the rapid expansion of Artificial Intelligence and Machine Learning (AI/ML) has amplified the demand for computational resources, with alarming projections for future energy consumption emphasizing the urgent need for transformative energy-efficient solutions. This growing reliance on computing underscores the transformative potential of energy-efficient technologies in achieving a Net Zero future.

As the energy efficiency of digital silicon electronics reaches a plateau due to the "End of Moore's Law," the demand for computing services has surged even more, especially with the widespread integration of AI/ML into nearly every aspect of modern life. For instance, consider the crash detection feature in smart devices, where a watch detects a crash and triggers an emergency call if the user fails to respond within a specific time frame, or the seamless interaction of devices through the Internet of Things (IoT). In an era of smart cars, learning thermostats, smart cribs, and even smart mirrors, learning devices are experiencing unprecedented growth. Consequently, the demand for computing power is expected to skyrocket. Electronic computers, however, face significant challenges in meeting this demand, including bottlenecks in power consumption, heat dissipation, and response speed, all of which contribute to substantial environmental costs.

Alternatively, optical computing—where data signals are represented as modulated optical beams within an optical circuit, rather than as electronic voltages on metal wires—offers potential advantages such as high-speed parallel processing and low power consumption. Historically, optical logic has been unachievable due to the absence of an integrated platform capable of supporting dense optical waveguide circuits. However, with the advent of silicon photonic foundry services, practical optical logic gates are now within reach. Previous optical logic concepts also lacked the desirable gain and scalability to be viable. Over the past few decades, extensive research in silicon photonics has facilitated the development of a wide range of integrated optical devices.

The techniques disclosed herein offer solutions to mitigate challenges described above. These include optical circuits, such as an all-optical Silicon Photonics (SiP) logic circuit concept (e.g., an all-optical transistor), called Photonic Absorption-Saturating Threshold Gate (PhAST-Gate). When integrated into photonic integrated circuits (PICs), this approach addresses energy efficiency challenges in advanced computing applications such as AI/ML systems. By contributing to the development of energy-efficient computing technologies, these techniques play an important role in advancing toward a sustainable society.

Furthermore, the PhAST-Gate avoids the energy and latency penalties associated with data transduction between the electrical and optical domains, which have traditionally hindered energy-efficient computing. It leverages Silicon Photonics (SiP) CMOS foundry services, which have emerged from existing electronic CMOS infrastructures. By combining coherent data encoding with non-linear elements in a device that consumes minimal energy and chip real estate, the PhAST-Gate enables the creation of high-speed, complex logic circuits. This approach addresses the data handling bottlenecks in AI/ML-based systems, with projections indicating an order-of-magnitude reduction in energy per operation for compute-intensive applications. As the energy consumption in high-throughput AI/ML systems is significantly impacted by the transduction between optical and electronic domains, by enabling computing and memory operations within the high-speed optical domain, the PhAST-Gate has the potential to dramatically enhance AI/ML performance and support applications such as edge computing and cryptography. When fully developed, the PhAST-Gate could break through existing barriers to realizing an end-to-end all-optical computing framework. This framework would be greener, faster, and more sustainable, offering a transformative solution to the growing challenges of energy consumption and computational efficiency.

Optical circuits disclosed herein, for example the PhAST gate, may include an optical micro-resonant cavity with a passive saturable absorber that serves as a thresholding device. Specifically, the micro-ring resonator (e.g., a Silicon-Germanium alloy) can function as a saturable absorber (SA) cavity. In some embodiments, the optical circuits may include a Y-splitter, a coupler, a phase modulator, an amplitude modulator, etc., all of which can be constructed from standard Silicon waveguides. In some embodiments, the optical circuits can be configured to encode binary data (e.g., "1" and "0") in the phase of the coherent optical signal. This encoding scheme allows the gain in the gate to be controlled through optical interference, which is used for arithmetic functions and memory operations. The coherent interferometric addition of signals takes advantage of the nonlinear "square law" response of the SA to achieve gain. The optical circuits may include a power (or pump) rail for coherent addition and level restoration. In some embodiments, the optical circuits disclosed herein utilize a combination of a non-linear optical resonator with coherent signaling, in which the digital 0's and 1's are encoded on the phase of the optical signal. The logic gate uses coherent optical coupling in the amplitude domain, and saturable absorption in the intensity domain (e.g., proportional to amplitude squared) to affect the logic functions with fanout (e.g., gain). The gain comes from the interferometric (e.g., coherent) combination of the data signal-carrying light and reference signal light. That is, no photons are generated at the gate to affect gain; rather the coherent coupling of the "power rail" signals provides the gain.

In some embodiments, the PhAST-Gate concept incorporates heterogeneous III-V Quantum Well-on-Si and/or Quantum Dot-on-Si photonic integrated platforms, which are developed for integrated laser technology with mode-locked designs. The III-V materials that provide nonlinear (NL) saturable gain/absorption for lasers can be integrated into the PhAST-Gate concept to provide the NL saturable absorption function for logic operations. By incorporating all-optical digital logic elements in photonic integrated circuits (PICs), the PhAST-Gate concept enhances SiP platforms by enabling all-optical SRAM, digital multipliers, and other digital circuits that can leverage the benefits of processing data in the optical domain while performing computations.

The optical circuits disclosed herein, such as PhAST-Gate-enabled circuits, can therefore improve the speed and energy efficiency of computing applications, including cryptography, datacom networking, in-memory processing, AI/ML applications, etc. AI/ML workloads are increasingly becoming the dominant energy-consuming component of cloud computing. These workloads includes two processes—training and inferencing—both of which are compute-intensive and rely on high-speed parallel processing of matrix-vector multiplication (MVM): massive datasets for training and high-throughput real-time data for inferencing. The core computation is the multiply-and-accumulate (MAC) function. Because training and inferencing involve extensive MAC operations, both can benefit from PhAST-Gate circuitry, which addresses latency and energy consumption bottlenecks.

As an example, an analog optical computing approach can be used for edge computing. In this approach, ultra-high-throughput ML multiply-and-accumulate (MAC) operations are performed on the edge client in the analog optical domain, where weight data are received at Terabit-per-second rates. An advantage of this approach is the avoidance of optical-electrical transduction, a major contributor to computational energy costs. However, challenges persist, such as variations in analog amplitude during transport over network fiber pathways and the energy demands of digital-to-analog and analog-to-digital conversion steps. A PhAST-Gate-based approach could overcome these challenges by processing data digitally while retaining it in the optical domain—where fiber communication systems already operate—eliminating the energy penalties associated with optical-to-electrical conversion. A recent internal ISI baseline study, analyzing projected energy consumption in an edge computing scenario, estimated an order-of-magnitude reduction in edge client power requirements when comparing an electronic computing approach to an optical computing approach utilizing PhAST-Gate circuits. This significant advantage results primarily from avoiding optical-to-electronic transduction and de-serialization, which are necessary for electronic computing nodes.

Illustrative embodiments are now described. Other embodiments can be used in addition or instead. Details that can be apparent to a person of ordinary skill in the art can have been omitted. Some embodiments can be practiced with additional components or steps and/or without all of the components or steps that are described.

FIG. 1 illustrates a block diagram of an example optical circuit 100 (e.g., an PhAST-Gate), in accordance with various embodiments. The optical circuit 100 includes an optical input path 110, a resonator 120 including a nonlinear optical material 125, an optical output path 130, an optical reference path 140, etc. An optical logic input 171, an optical input signal 173, a first reference signal 141, an optical output signal 175, a second reference signal 143, and an optical logic output 177 are shown. The optical circuit 100 of FIG. 1 is simplified for illustrative purposes, and thus, can be implemented as any of various other configurations while remaining within the scope of the present disclosure. In some examples, the optical circuit 100 can include more, fewer, or different components than shown in the figure.

In some embodiments, the optical input path 110 may be or include a waveguide, an optical fiber, a nanostructure, or any component configured to function as a trajectory through which a signal (e.g., an optical signal, the optical logic input 171, the optical input signal 173, the first reference signal 141, etc.) can travel. In some embodiments, the optical input path 110 can be operatively (e.g., optically) coupled with one or more components. For example, as shown, the optical input path 110 is optically coupled to the resonator 120. In some embodiments, the optical input path 110 can be operatively coupled with a plurality of logic inputs to receive the plurality of logic inputs. In some embodiments, the plurality of logic inputs can be or include optical signals. In some embodiments, as discussed in greater detail below, at least one of the plurality of logic inputs can be a substantially-zero input serving as a logic state. In some embodiments, the optical input path 110 can be configured to generate the optical logic input 171 based on the plurality of logic inputs. In some embodiments, the optical input path 110 can be operatively coupled with the optical reference path 140 and receive the first reference signal 141. In some embodiments, the optical input path 110 can be configured to generate the optical input signal 173 based on the optical logic input 171 and the first reference signal 141. In some embodiments, the optical input path 110 can be operatively coupled with or include a first optical coupler configured to combine the optical logic input 171 with the first optical reference signal 141 and generate the optical input signal 173. The optical input path 110 can be configured to couple the optical input signal 173 to the resonator 120. For example, the optical input path 110 can be optically coupled with an input of the resonator 120 and provide the optical logic input 171, the optical input signal 173, etc.

In some embodiments, the optical output path 130 may be or include a waveguide, an optical fiber, a nanostructure, or any component configured to function as a trajectory through which a signal (e.g., an optical signal, the optical output signal 175, the optical logic output 177, the second reference signal 143, etc.) can travel. In some embodiments, the optical output path 130 can be operatively (e.g., optically) coupled with one or more components. For example, as shown, the optical output path 130 is optically coupled to the resonator 120. In some embodiments, the optical output path 130 can be operatively coupled with an output of the resonator 120 and receive the optical output signal 175 therefrom. In some embodiments, the optical output path 130 can be configured to generate the optical logic output 177 based on the optical output signal 175. In some embodiments, the optical output path 130 can be operatively coupled with the optical reference path 140 and receive the second reference signal 143. In some embodiments, the optical output path 130 can be configured to generate the optical logic output 177 based on the optical output signal 175 and the second reference signal 143. In some embodiments, the optical output path 130 can be configured to provide the optical logic output 177 based on the optical output signal 175 and the second reference signal 143. The optical logic output 177 can correspond to an output logic state. In some embodiments, the optical output path 130 can be operatively coupled with or include a second optical coupler configured to combine the optical output signal 175 with the second reference signal 143 to generate the optical logic output 177. The optical output path 130 can be configured to couple the optical logic output 177 to one or more components, as discussed in greater detail below. For example, the optical output path 130 can be optically coupled with a plurality of fanout paths, an input of another resonator, an output of another resonator, etc.

In some embodiments, the optical reference path 140 may be or include a waveguide, an optical fiber, a nanostructure, or any component configured to function as a trajectory through which a signal (e.g., an optical reference signal, the first reference signal 141, the second reference signal 143, etc.) can travel. In some embodiments, the optical reference path 140 can be operatively (e.g., optically) coupled with one or more components. In some embodiments, the optical reference path 140 can be operatively coupled with the optical input path 110 and provide the first reference signal 141 thereto. In some embodiments, the optical reference path 140 can be operatively coupled with the optical output path 130 and provide the second reference signal 143 thereto. The optical reference signal can be sometimes referred to as an optical "power" signal, an optical "pump" signal, an optical "ground" signal, etc. While discussed in greater detail below, adding coherent reference signals (e.g., the first reference signal 141, the second reference signal 143, etc.) interferometrically at the optical input path 110 and the optical output path 130 allows the nonlinear response of a SA (e.g., the nonlinear optical material 125) to achieve gain.

In some embodiments, the optical reference path 140 can be operatively coupled with or include an optic (e.g., a splitter) (not shown) configured to split an optical reference signal into the first reference signal 141 and the second reference signal 143. In some embodiments, the optical reference path 140 can be operatively coupled with or include a phase shifter or any component configured to control, modulate, or otherwise change a first phase of the first reference signal 141 and/or a second phase of the second reference signal 143. In some embodiments, the optical reference path 140 can be designed, arranged, or otherwise configured such that the first reference signal 141 and the second reference signal 143 can have predetermined phases when coupled to the optical input path 110 and the optical output path 130, respectively. For example, the optical reference path 140 can be designed to have an optical path length that allows the first reference signal 141 to have a predetermined phase when coupled to the optical input path 110. The optical reference path 140 can be designed to have an optical path length that allows the second reference signal 143 to have a predetermined phase when coupled to the optical output path 130.

In some embodiments, the resonator 120 may be or include an optical cavity, an optical ring resonator, a micro ring resonator, a Fabry-Perot (FP) resonator, or any structure configured to circulate light at a resonant wavelength. In some embodiments, the resonator 120 includes an input and an output. The input of the resonator 120 can be optically coupled with the optical input path 110. The input of the resonator 120 can be configured to receive the optical input signal 173 that includes the optical logic input 171 and the first optical reference signal 141. For example, the input of the resonator 120 can receive a combined version of the optical logic input 171 and the first optical reference signal 141. The output of the resonator 120 can be optically coupled with the optical output path 130.

As shown in FIG. 1, the resonator 120 includes the nonlinear optical material 125 having intensity-dependent absorption. In some embodiments, the nonlinear optical material 125 may be or include a multi-quantum well (MQW), quantum dots (QDs), or any material or structure configured to enhance the nonlinearity of the resonator 120. In some embodiments, the nonlinear optical material 125 can be configured to exhibit the saturable absorber (SA) effect. In some embodiments, the nonlinear optical material 125 can be configured to transmit the optical input signal 173 as the optical output signal 175 in response to the optical input signal 173 exceeding the intensity threshold (e.g., of the nonlinear optical material 125). The nonlinear optical material 125 can be configured to absorb the optical input signal 173 to not transmit the optical output signal 175 in response to the optical input signal 173 being below the intensity threshold (e.g., of the nonlinear optical material 125). That is, the resonator 120 can be configured to provide the optical output signal 175 based on the optical logic input 171, the first reference signal 141, and the intensity threshold of the nonlinear optical material 125.

The resonator 120 including the nonlinear optical material 125 serving as a SA can function as a thresholding device. As used herein, the "threshold" refers to the intensity or power level of incident light (e.g., the optical input signal 173) at which the properties of the SA change significantly, allowing the resonator 120 to switch from an absorbing to a transmitting state. That is, the threshold is the intensity of light at which the SA transitions from absorbing (most of) the light to transmitting more of it. Below this threshold, the light intensity is too low to saturate the absorber, so (most of) the light is absorbed, and very little (near zero) is transmitted. Above the threshold, the absorber becomes transparent enough to allow significant transmission through the resonator. In some embodiments, the nonlinear optical material 125 may be or include any material or structure configured to function as a SA such that the nonlinear optical material 125 absorbs light at low intensities but becomes increasingly transparent as the light intensity increases beyond an intensity threshold of the nonlinear optical material 125 (as the material's absorption saturates). The integration of the nonlinear material 125 in the resonator 120 can thereby enhance the nonlinear thresholding and/or its contrast ratio.

Figure 2:
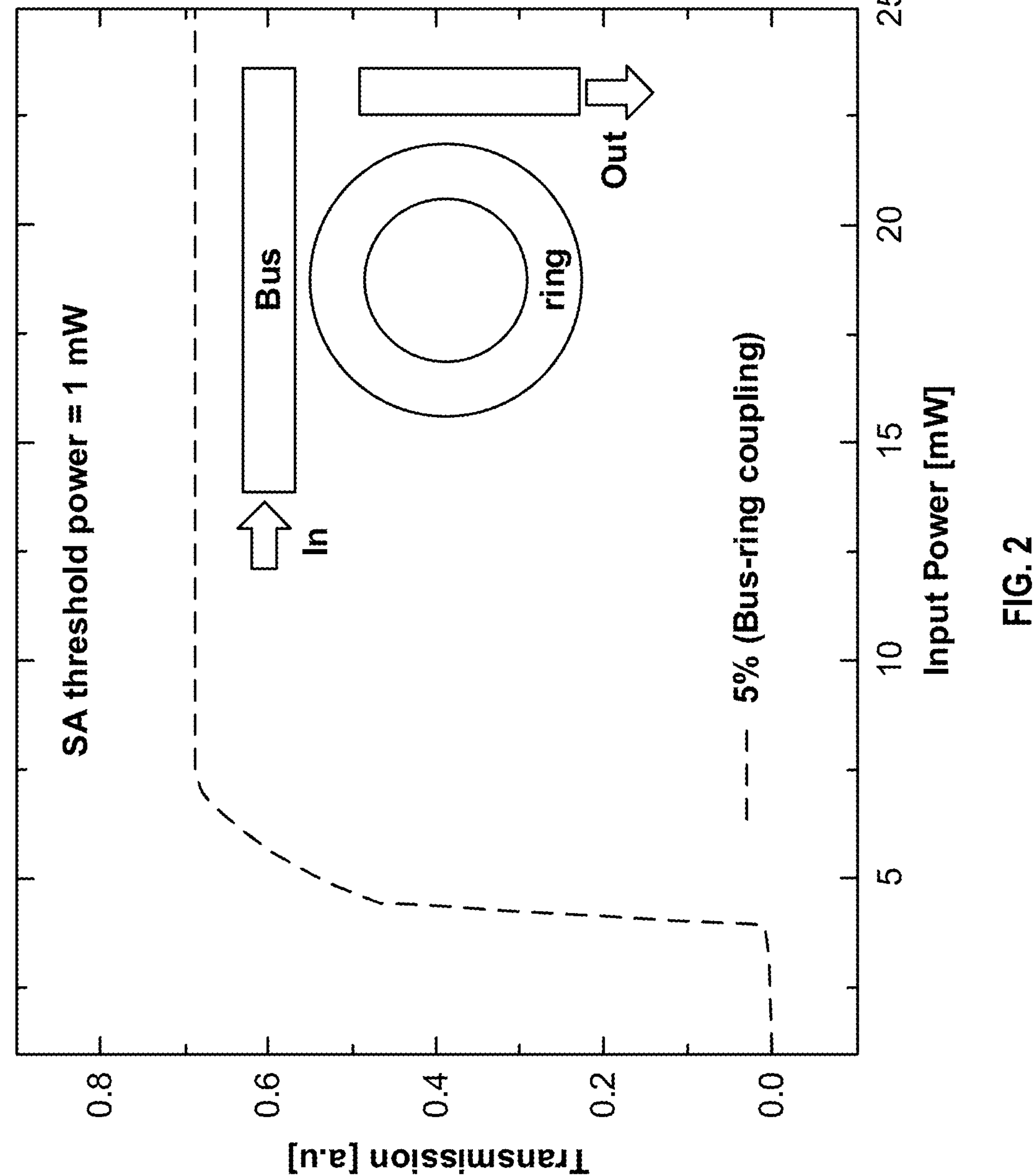
FIG. 2 illustrates an example waveform associated with the optical circuit of FIG. 1, in accordance with various embodiments.

FIG. 2 illustrates an example waveform associated with the optical circuit 100, in accordance with various embodiments. Specifically, the waveform illustrates a nonlinear response (e.g., the threshold-dependent behavior) of a resonator (e.g., the resonator 120, the ring resonator shown in FIG. 2, etc.). In some embodiments, the "Input Power" of the x-axis represents the intensity of the optical input signal 173, while the "Transmission" of the y-axis represents the intensity of the optical output signal 175. As shown, in response to the intensity of the optical input signal 173 being below the intensity threshold (e.g., too low to saturate the nonlinear optical material 125), the nonlinear optical material 125 can be configured to absorb the light (or most of), resulting in near zero transmission. In response to the intensity of the optical input signal 173 exceeding the intensity threshold, the absorber becomes transparent enough to allow significant transmission through the resonator 120. This threshold-dependent behavior can enable the resonator 120 to function as a nonlinear optical device. In some embodiments, the optical circuits (e.g., the optical circuit 100) as disclosed herein can be configured to perform Binary Phase Shift Keying (BPSK) for data encoding. For example, the optical circuits as disclosed herein can be configured to perform various operations including encoding of a logic state (e.g., "0," "1," etc.) (e.g., in a phase of a coherent optical signal), as described in greater detail below.

Figures 3A, 3B, 3C:
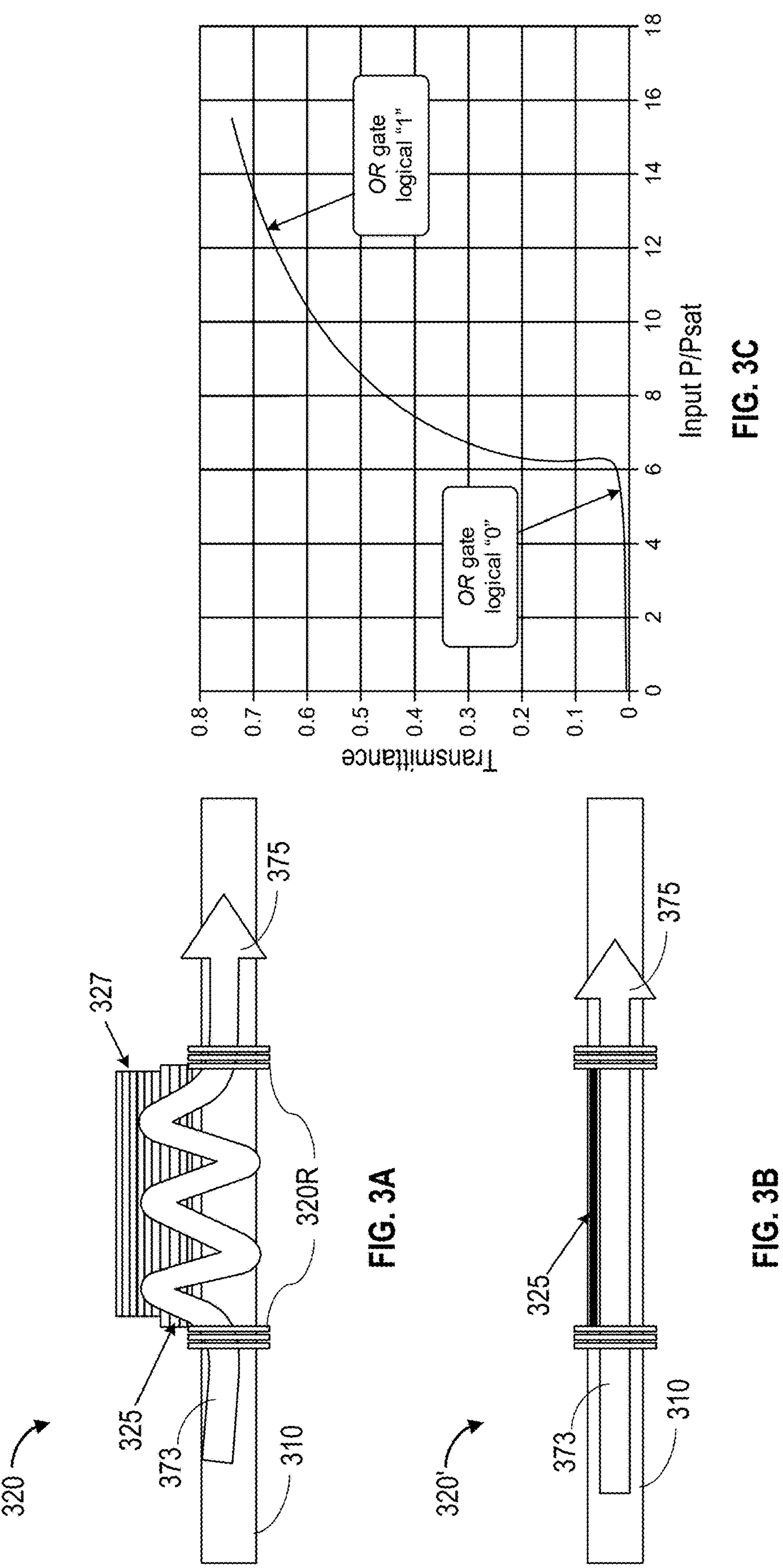
FIG. 3A illustrates a schematic diagram (side view) of an example resonator, in accordance with various embodiments.
FIG. 3B illustrates a schematic diagram (side view) of an example resonator, in accordance with various embodiments.
FIG. 3C illustrates an example waveform associated with a resonator, in accordance with various embodiments.

Referring to FIG. 1, the resonator 120 and the nonlinear optical material 125 can be implemented in various manners. Example configurations of the resonator and the nonlinear optical material disclosed herein are now discussed. FIG. 3A illustrates a schematic diagram (side view) of an example resonator 320, in accordance with various embodiments. The resonator 320 of FIG. 3A includes a waveguide 310, a first reflector 320R, a nonlinear optical material 325, a second reflector 327, etc. The resonator 320 shown in FIG. 3A is simplified for illustrative purposes, and thus, can be implemented as any of various other configurations while remaining within the scope of the present disclosure. In some examples, the resonator 320 can include more, fewer, or different components than shown in the figure.

The resonator 320 can be or include an optical cavity included in and/or optically coupled with the waveguide 310. In some embodiments, as shown in FIG. 3A, the resonator 320 can include the first reflector 320R configured to form an optical cavity within the resonator 320. In some embodiments, the first reflector 320R can be a pair of etched mirrors or any structure configured to reflect light back and forth between the first reflector 320R. The resonator 320 is shown to include the nonlinear optical material 325. In some embodiments, the nonlinear optical material 325 may be or include a multi quantum well (MQW) absorber or any structure or material configured to server as a SA. In some embodiments, the nonlinear optical material 325 can be or include a quantum dot. As shown, the nonlinear optical material 325 can be disposed (e.g., formed, deposited, etc.) on a top surface of the waveguide 310 (or the resonator 320). In some embodiments, the resonator 320 can include the second reflector 327. In some embodiments, the second reflector 327 can be or include an etched mirror, a distributed Bragg reflector (DBR) or any structure or material configured to reflect light from the nonlinear optical material 325 towards the waveguide 310.

Described and shown with respect to FIG. 3A is a non-limiting example of the resonator and the nonlinear optical material. Although shown as a FP resonator, the resonator 320 can be a ring resonator, in some embodiments. While the nonlinear optical material 325 can be or include various materials or structures as discussed above, the nonlinear optical material 325 can be coupled to the waveguide 310 in flexible manners. FIG. 3B illustrates a schematic diagram (side view) of an example resonator 320', in accordance with various embodiments. In some embodiments, the resonator 320' of FIG. 3B may be substantially similar to or incorporate features of the resonator 320 of FIG. 3A. In some embodiments, the resonator 320' can include the nonlinear optical material 325 within a trench of the waveguide 310 (or the resonator 320'). In some embodiments, although not shown, any material or structure (e.g., the second reflector 327, etc.) can be included within the trench of the waveguide 310. The resonator 320' shown in FIG. 3B is simplified for illustrative purposes, and thus, can be implemented as any of various other configurations while remaining within the scope of the present disclosure. In some examples, the resonator 320' can include more, fewer, or different components than shown in the figure. In the resonator 320 (and the resonator 320'), the nonlinear optical material 325 can absorb an optical input signal 373 to not transmit an optical output signal 375 in response to the optical input signal 373 being below the intensity threshold (e.g., of the nonlinear optical material 325). In some embodiments, the nonlinear optical material 325 can transmit the optical input signal 373 as the optical output signal 375 in response to the optical input signal 373 exceeding the intensity threshold (e.g., of the nonlinear optical material 325).

FIG. 3C illustrates an example waveform associated with the resonator 320, in accordance with various embodiments. Specifically, the waveform illustrates a nonlinear response (e.g., the threshold-dependent behavior) of a resonator (e.g., the resonators disclosed herein, including the resonators 120, 320, 320', etc.). In FIG. 3C, the x-axis represents the input power (P) of the optical input signal 373 relative to the saturation power level (Psat) of the nonlinear optical material 325 (e.g., a power corresponding to the intensity threshold), while the y-axis represents the transmittance of the optical output signal 375. As shown in FIG. 3C, a nonlinear transition occurs at around x=6.2 from a first logic state to a second logic state. As described in greater detail below, the resonator 320 (and the resonator 320') can be configured to function as a logic gate. In some embodiments, as shown, the resonator 320 (and the resonator 320') can function as a logic OR gate configured to output a first logic state (e.g., "0") and a second logic state (e.g., "1"). This allows for a high contrast ration with an ON-transmittance high enough to achieve a fanout of 2.

Figure 4B:
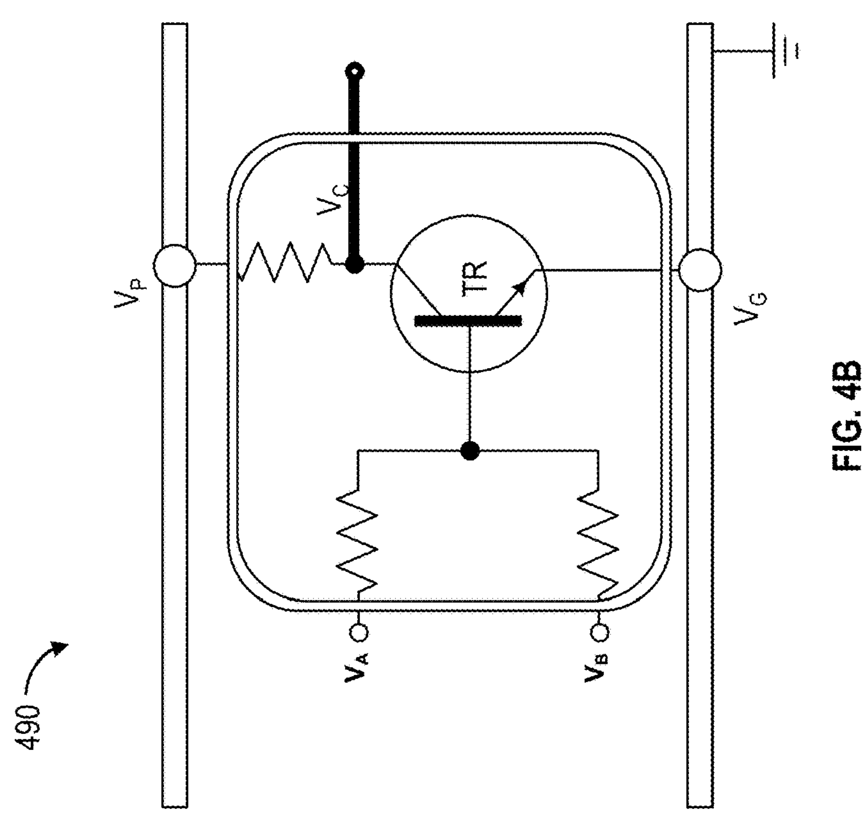
FIG. 4B illustrates an example electrical circuit corresponding to the optical circuit of FIG. 4A, in accordance with various embodiments.
Figure 4A:
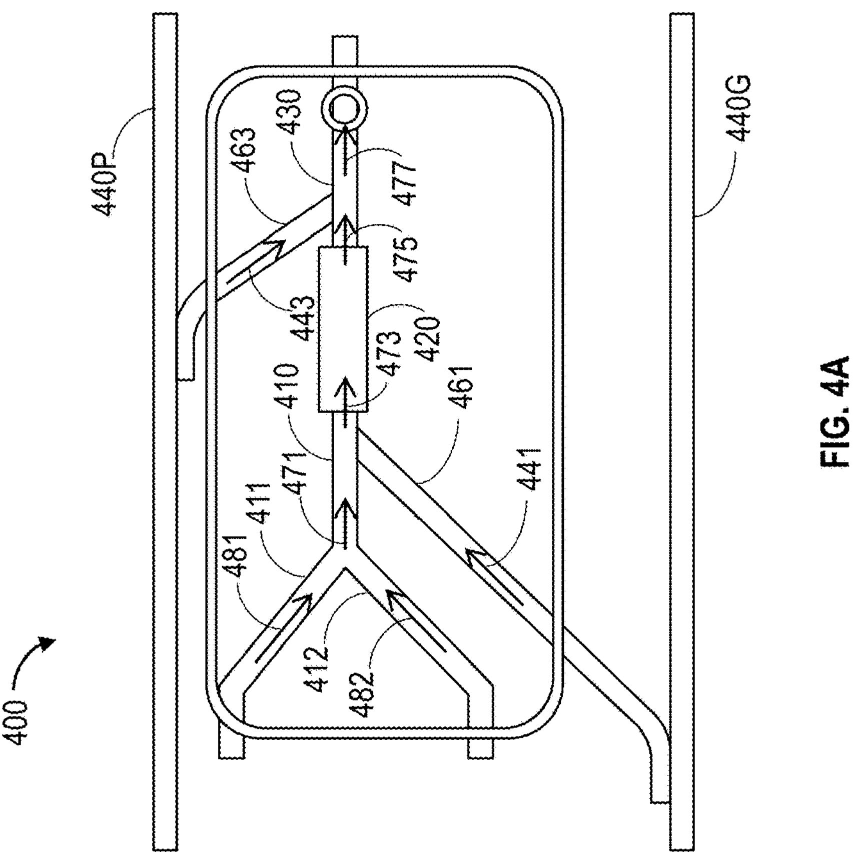
FIG. 4A illustrates a schematic diagram of an example optical circuit, in accordance with various embodiments.

The optical circuits as disclosed herein (e.g., the optical circuit 100, etc.) can include an optical reference path (e.g., the optical reference path) configured to provide a reference signal. Adding such a reference signal allows the nonlinear response of the SA to achieve gain (e.g., high enough for a fanout). FIG. 4A illustrates a schematic diagram of an example optical circuit 400, in accordance with various embodiments. In some embodiments, the optical circuit 400 may be substantially similar to or incorporate features of the optical circuit 100. For example, the optical circuit 400 includes an optical input path 410, a resonator 420 (e.g., including a nonlinear optical material, a SA, etc.), an optical output path 430, a first optical reference path 440G, a first optical reference signal path 461, a second optical reference path 440P, a second optical reference signal path 463, etc. The optical circuit 400 shown in FIG. 4A is simplified for illustrative purposes, and thus, can be implemented as any of various other configurations while remaining within the scope of the present disclosure. In some examples, the optical circuit 400 can include more, fewer, or different components than shown in the figure.

In some embodiments, as shown, the optical circuit 400 includes separate optical reference paths, such as the first optical reference path 440G and the second optical reference path 440P. The first optical reference path 440G can be operatively coupled with the optical input path 410 and provide a first reference signal 441 thereto. The second optical reference path 440P can be operatively coupled with the optical output path 430 and provide a second reference signal 443 thereto. In some embodiments, the first reference signal 441 can have a first phase, and the second reference signal 443 can have a second phase. In some embodiments, a phase difference between the first phase and the second phase can be predetermined. For example, the phase difference between the first phase and the second phase may be 0, π, etc. For example, the first reference signal 441 traveling the first optical reference path 440G may be at the first phase of π (in this case, the first optical reference path 440G can be referred to as a photonic "Ground" rail). The second reference signal 443 traveling the second optical reference path 440P may be at the second of π (in this case, the second optical reference path 440P can be referred to as a photonic "Power" rail). In some embodiments, the phase difference can be predetermined based on a design, shape, geometry, dimension, etc. of the first optical reference path 440G and the second optical reference path 440P.

The optical circuits (e.g., the optical circuits 100, 400, etc.) as disclosed herein can be configured to function as an optical transistor similar to an electrical circuit including a transistor. In some embodiments, the optical input path 410 can configured to receive a plurality of logic inputs from a first logic input path 411 and a second logic input path 412. In some embodiments, the optical input path 410 can configured to generate an optical logic input 471 based on a first logic input 481 from the first logic input path 411 and a second logic input 482 from the second logic input path 412.

In some embodiments, the optical input path 410 can be configured to receive the first reference signal 441 and combine into the optical logic input 471 to generate an optical input signal 473. The resonator 420 can be configured to receive the optical input signal 473 as an input, and provide an optical output signal 475. As discussed above, the resonator 420, which can include a nonlinear optical material and serve as a SA, can be configured to as an optical transistor (e.g., a thresholding device). For example, the resonator 420 is configured to provide the optical output signal 475 with a first logic state or a second logic state based on the optical logic input 471. The optical output path 430 can receive the optical output signal 475 from the resonator 420. In some embodiments, the optical output path 430 can be configured to receive the second reference signal 443 and combine into the optical output signal 475. This coherent coupling of data signals (e.g., the optical logic input 471, the optical output signal 475, etc.) with the "photonic power rails" (e.g., the first reference signal 441, the second reference signal 443, etc.) allows for gate-level gain for fanout (e.g., for level restoration) and cascadability while acting as a coherent power source for each gate to enable high circuit density and complexity.

The optical output path 430 can then provide an optical logic output 477 as an output. As discussed herein, the optical circuits (e.g., the optical circuit 100, the optical circuit 400, etc.) can be configured to function as an optical transistor (e.g., similar to an electrical transistor). FIG. 4B illustrates an example electrical circuit 490 corresponding to the optical circuit 400, in accordance with various embodiments. In some embodiments, the electrical circuit 490 may be an electrical equivalent of the optical circuit 400. In the electrical circuit 490, a transistor TR can receive a combined version of a first logic input ($V_A$) and a second logic input ($V_B$) through a gate terminal. The transistor TR can receive a first voltage ($V_P$) (e.g., a supply voltage) through a first source/drain terminal. The transistor TR can receive a second voltage ($V_G$) (e.g., a ground voltage) through a second source/drain terminal. Based on the combined voltage coupled to the gate terminal, the first voltage ($V_P$), and the second voltage ($V_G$), the transistor TR can provide an output ($V_C$). In some embodiments, the optical circuit 400 can be configured to perform a logic operation that can be performed by the electrical circuit 490. It should be noted that both the optical circuit 400 and the electrical circuit 490 can be a three-terminal device having connections to "Power" and "Ground" while operating based on a nonlinear saturation effect. In some embodiments, the optical circuit 400 can be configured to serve as a bipolar transistor-based logic gate. For example, the optical circuit 400 can be configured to encode an optical signal, as discussed in greater detail below.

Figure 5:
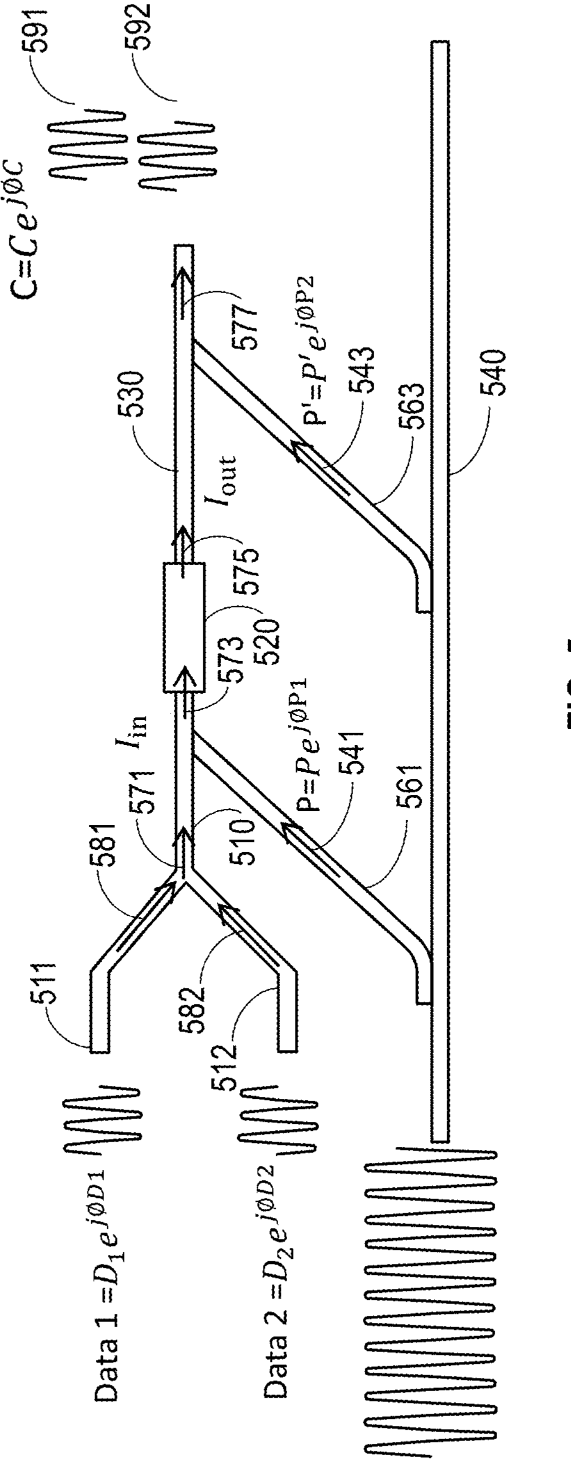
FIG. 5 illustrates a schematic diagram of an example optical circuit, in accordance with various embodiments.

FIG. 5 illustrates a schematic diagram of an example optical circuit 500, in accordance with various embodiments. In some embodiments, the optical circuit 500 may be substantially similar to or incorporate features of the optical circuits 100, 400, etc. For example, the optical circuit 500 includes an optical input path 510, a first logic input path 511, a second logic input path 512, a resonator 520 (e.g., including a nonlinear optical material, a SA, etc.), an optical output path 530, an optical reference path 540, a first optical reference signal path 561, a second optical reference signal path 563, etc. The optical circuit 500 shown in FIG. 5 is simplified for illustrative purposes, and thus, can be implemented as any of various other configurations while remaining within the scope of the present disclosure. In some examples, the optical circuit 500 can include more, fewer, or different components than shown in the figure.

The first logic input path 511 can receive a first logic input 581, and the second logic input path 512 can receive a second logic input 582. In some embodiments, the first logic input 581 can be an optical signal defined as Data 1 ($=D_1 \exp(j\emptyset_{D1})$), and the second logic input 582 can be an optical signal defined as Data 1 ($=D_2 \exp(j\emptyset_{D2})$). In some embodiments, the first logic input 581 can have a first phase, and the second logic input 582 can have a second phase. In some embodiments, a phase difference between the first phase and the second phase can be predetermined. For example, the phase difference between the first phase and the second phase may be 0, π, etc. In some embodiments, the first logic input 581 can correspond to a first logic state, based on a first intensity and/or the first phase of the first logic input 581. In some embodiments, the second logic input 582 can correspond to a second logic state, based on a second intensity and/or the second phase of the second logic input 582.

The first logic input 581 and the second logic input 582 can be combined into an optical logic input 571, which then can be combined with a first reference signal 541 defined as P ($=Pe^{j\emptyset P1}$). An optical input signal 573 can then be generated and input to the resonator 520. Here, an intensity of the optical input signal 573 can be defined as $$I_{in} = \left|\frac{D_1}{2} + \frac{D_2}{2} + \frac{P_0}{2}\right|,$$

in some embodiments. Thus, in some embodiments, the intensity of the optical input signal 573 can be determined based on the first intensity and/or the first phase of the first logic input 581, the second intensity and/or the second phase of the second logic input 582, an intensity and/or a phase of the first reference signal 541. The resonator 520 can be configured to provide an optical output signal 575 based on the optical input signal 573. As discussed above, the resonator 520 can transmit the optical input signal 573 as the optical output signal 575 when the intensity (e.g., $I_{in}$) of the optical input signal 573 is above an intensity threshold (e.g., of the nonlinear optical material of the resonator 520). The resonator 520 can absorb the optical input signal 573 to not transmit the optical output signal 575 when the intensity of the optical input signal 573 is below the intensity threshold. The optical output signal 575 can be combined with a second reference signal 543 defined as P' ($=P'e^{j\emptyset P2}$). The optical output path 530 can generate an optical logic output 577, defined as C ($=Ce^{j\emptyset C}$), based on the optical output signal 575 and the second reference signal 543. In some embodiments, the optical logic output 577 can be a first optical logic output signal having a first phase 591. The first phase 591 may be associated with a first logic state. The optical logic output 577 can be a second optical logic output signal having a second phase 592. The second phase 592 may be associated with a second logic state. This can thereby allow for encoding of logic states in an amplitude and/or a phase of an optical signal.

Figure 6:
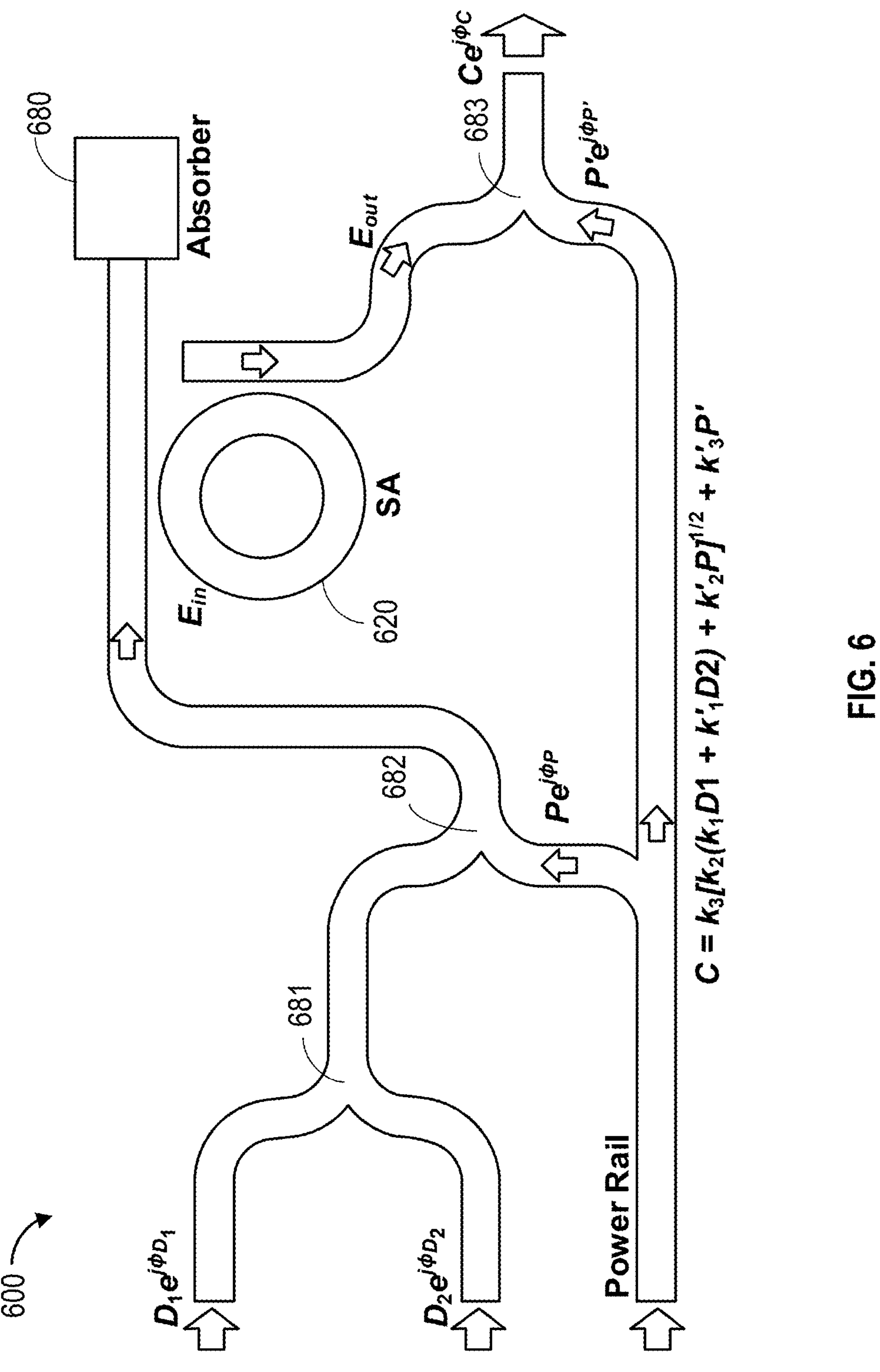
FIG. 6 illustrates a schematic diagram of an example optical circuit, in accordance with various embodiments.

The optical circuits (e.g., the optical circuits 100, 400, 500, etc.) disclosed herein can include various components while arranged in flexible manners. In some embodiments, the optical circuit can include a ring resonator, a FP resonator, etc. configured to serve as a resonator discussed above. In some embodiments, the optical circuit can include an absorber coupled to an optical input path, an optical output path, an optical reference path, etc. FIG. 6 illustrates a schematic diagram of an example optical circuit 600, in accordance with various embodiments. In some embodiments, the optical circuit 600 may be substantially similar to or incorporate features of the optical circuits 100, 400, 500, etc. The optical circuit 600 shown in FIG. 6 is simplified for illustrative purposes, and thus, can be implemented as any of various other configurations while remaining within the scope of the present disclosure. In some examples, the optical circuit 600 can include more, fewer, or different components than shown in the figure.

In some embodiments, the optical circuit 600 can include an absorber 680 (e.g., additionally as opposed to the optical circuit 500). In some embodiments, the absorber 680 can be or include a photonic crystal absorber, a metallic film, etc., or any material or structure configured to absorb the light (e.g., an optical logic input, an optical logic output, a reference signal, etc.) in the optical circuit 600. In some embodiments, the absorber 680 can be optically coupled to any other portion of the optical circuit 600 for various purposes. In some embodiments, the optical circuit 600 can include a ring resonator 620 (e.g., including a nonlinear optical material, a SA, etc.).

In some embodiments, the optical circuit 600 can include a coupler. The coupler can be or include, but not limited to, an optical coupler, an optical combiner, or any optic configured to combine two optical signals. In some embodiments, the optical circuit 600 includes the coupler at a Y-junction 681, and the coupler can be configured to combine data inputs D1 (=$D_1$ exp(j$Ø_{D1}$)) and D2 (=$D_2$ exp (j$Ø_{D2}$)). In some embodiments, the data input D1 can be coupled through the coupler with a coupling coefficient of k1. The data input D2 can be coupled through the coupler with a coupling coefficient of k1'. In some embodiments, the optical circuit 600 includes the coupler at a Y-junction 682, and the coupler can be configured to combine a combined version of the data inputs D1 (=$D_1$ exp(j$Ø_{D1}$)) and D2 (=$D_2$ exp(j$Ø_{D2}$)) with a first reference signal P (=P'$e^{jØP1}$). In some embodiments, the combined version of the data inputs can be coupled through the coupler with a coupling coefficient of k2. The first reference signal can be coupled through the coupler with a coupling coefficient of k2'. In some embodiments, the optical circuit 600 includes the coupler at a Y-junction 683, and the coupler can be configured to combine an optical logic output (e.g., from the resonator 620) with a second reference signal P' (=P'$e^{jØP2}$). In some embodiments, the optical logic output can be coupled through the coupler with a coupling coefficient of k3. The second reference signal can be coupled through the coupler with a coupling coefficient of k3'. In some embodiments, when the optical circuit 600 includes the couplers at all the Y-junctions 681, 682, 683, the optical logic output can be defined as C (=C$e^{jØC}$), where C is $k_3[k_2(k_1D1+k'_1 D2)+k'_2P]^{1/2}+k'_3P'$, and corresponds to a first logic state (e.g., "0") or a second logic state (e.g., "1"). That is, in some embodiments, the logic state of the optical logic output can be determined based on a first intensity and/or a first phase of the first data input D1, a second intensity and/or a second phase of the second data input D2, and a coupling coefficient of the coupler (e.g., at least one of the coupler at the Y-junctions 681, 682, 683).

In some embodiments, the data inputs D1 (=$D_1$ exp (j$Ø_{D1}$)) and D2 (=$D_1$ exp(j$Ø_{D2}$)) can be Binary Phase Shift Keying (BPSK) encoded. For example, $Ø_C$=0 can correspond to a first logic state (e.g., "0"), and $Ø_C$=π can correspond to a second logic state (e.g., "1"). In some embodiments, the amplitude (e.g., C) can be identical for both the first logic state and the second logic state. In some embodiments, the "pump" and "ground" signals, P and P', respectively, can be out of phase. For example, the first reference signal P (=P$e^{jØP1}$) can be completely out of phase with respect to the second reference signal P' (=P'$e^{jØP2}$). For example, ØP1 may be 0, and ØP2 may be π. In some embodiments, the phases of the reference signals can be controlled and/or predetermined based on a design, shape, geometry, dimension, etc. of the optical reference paths. In some embodiments, the optical reference path can be operatively coupled with or include a phase shifter or any component configured to control, modulate, or otherwise change a phase of the reference signal.

This coupling of the reference signals to the input and output of the optical circuit 600 enables the fanout-of-2 for practical digital circuitry. The optical circuit 600 can be configured to perform various operations including encoding of a logic state by controlling the phases of the first reference signal P and/or of the second reference signal P'.

The optical circuits (e.g., the optical circuits 100, 400, 500, 600, etc.) disclosed herein can be configured to perform various operations including encoding of a logic state (e.g., "0," "1," etc.) in an amplitude and/or a phase of a coherent optical signal, as described in greater detail below. In some embodiments, the optical circuit can be configured to perform one of operations: AND, OR, NOT, NAND, NOR, XOR, XNOR, flip flop, modulation, demodulation, etc. The optical input path (e.g., the optical input path 110) can be configured to serve as an input (e.g., a logic input) and the optical output path (e.g., the optical output path 130) can be configured to serve as an output (e.g., a logic output). With the foregoing in mind, the figures and description below illustrate examples of the optical circuit. It should be noted that the figures and description below are non-limiting examples and can be implemented as any of various other configurations while remaining within the scope of the present disclosure.

Figure 7:
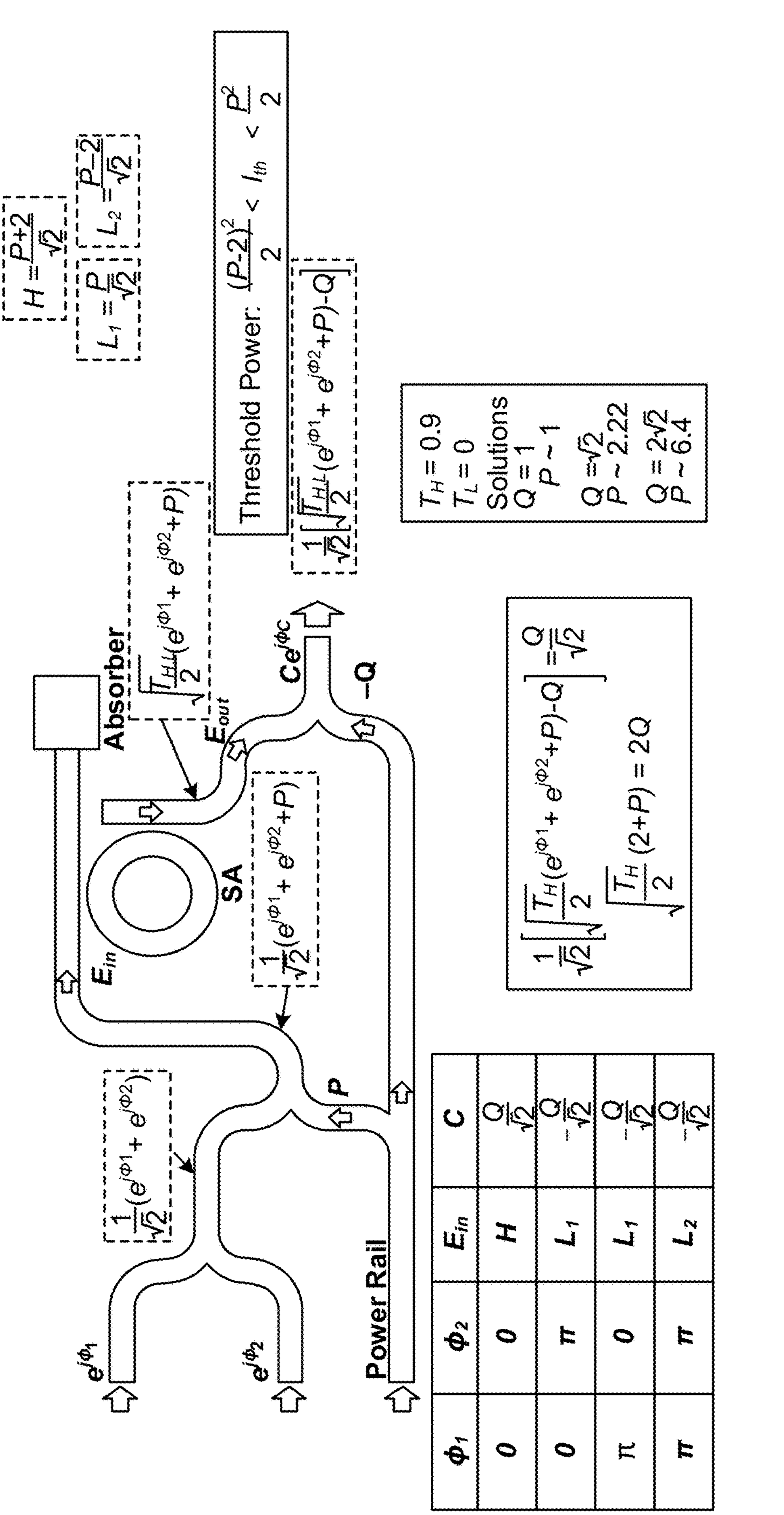
FIG. 7 illustrates an example implementation of an optical circuit along with an example truth table, in accordance with various embodiments.

FIG. 7 illustrates an example implementation of an optical circuit (e.g., the optical circuits 100, 400, 500, 600, etc.) along with an example truth table, in accordance with various embodiments. In some embodiments, shown in FIG. 7 is an example implementation of the optical circuit 600 for a logic OR operation. As shown, when a first logic input is at a first state (e.g., "0") with a first phase $Ø_1$ of 0 and a second logic input is at a second state (e.g., "0") with a second phase $Ø_2$ of 0, an optical logic output, C (=C exp(jØC)), can be provided with a first logic state (e.g., "0") with an output amplitude of C=Q/$\sqrt{2}$. When the first logic input is at a first state (e.g., "0") with a first phase $Ø_1$ of π and the second logic input is at a second state (e.g., "1") with a second phase $Ø_2$ of π, the optical logic output, C (=C exp(jØC)), can be provided with a second logic state (e.g., "1") with an output amplitude C=−Q/$\sqrt{2}$. When the first logic input is at a first state (e.g., "1") with a first phase $Ø_1$ of π and the second logic input is at a second state (e.g., "0") with a second phase $Ø_2$ of π, the optical logic output, C (=C exp(jØC)), can be provided with the second logic state (e.g., "1") with an output amplitude C=−Q/$\sqrt{2}$. When the first logic input is at a first state (e.g., "1") with a first phase $Ø_1$ of π and the second logic input is at a second state (e.g., "1") with a second phase $Ø_2$ of π, the optical logic output, C (=C exp(jØC)), can be provided with the second logic state (e.g., "1") with an output amplitude of C=−Q/$\sqrt{2}$.

Figure 8:
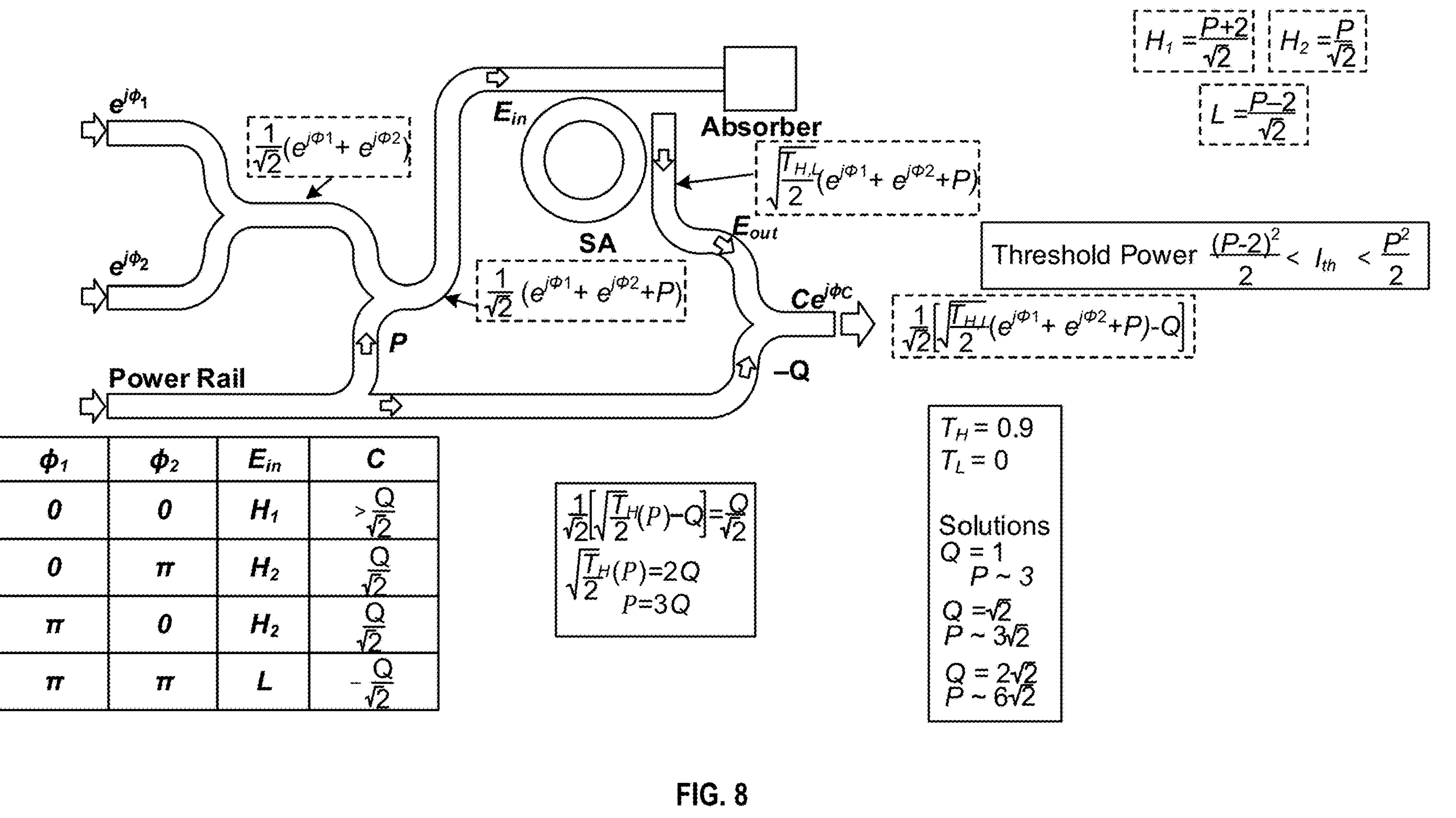
FIG. 8 illustrates an example implementation of an optical circuit along with an example truth table, in accordance with various embodiments.

FIG. 8 illustrates an example implementation of an optical circuit (e.g., the optical circuits 100, 400, 500, 600, etc.) along with an example truth table, in accordance with various embodiments. In some embodiments, shown in FIG. 8 is an example implementation of the optical circuit 600 for a logic AND operation. As shown, when a first logic input is at a first state (e.g., "0") with a first phase $Ø_1$ of π and a second logic input is at a second state (e.g., "0") with a second phase $Ø_2$ of 0, an optical logic output, C (=C exp(jØC)), can be provided with a first logic state (e.g., "0") with an output amplitude of C>Q/$\sqrt{2}$. When the first logic input is at a first state (e.g., "0") with a first phase $Ø_1$ of π and the second logic input is at a second state (e.g., "1") with a second phase $Ø_2$ of $\pi$, the optical logic output, C (=C exp(jØC)), can be provided with the first logic state (e.g., "0") with an output amplitude of $C=Q/\sqrt{2}$. When the first logic input is at a first state (e.g., "1") with a first phase $Ø_1$ of $\pi$ and the second logic input is at a second state (e.g., "0") with a second phase $Ø_2$ of 0, the optical logic output, C (=C exp(jØC)), can be provided with the first logic state (e.g., "0") with an output amplitude of $C=Q/\sqrt{2}$. When the first logic input is at a first state (e.g., "1") with a first phase $Ø_1$ of $\pi$ and the second logic input is at a second state (e.g., "1") with a second phase $Ø_2$ of $\pi$, the optical logic output, C (=C exp(jØC)), can be provided with the first logic state (e.g., "1") with an output amplitude of $C=-Q/\sqrt{2}$.

Figure 9:
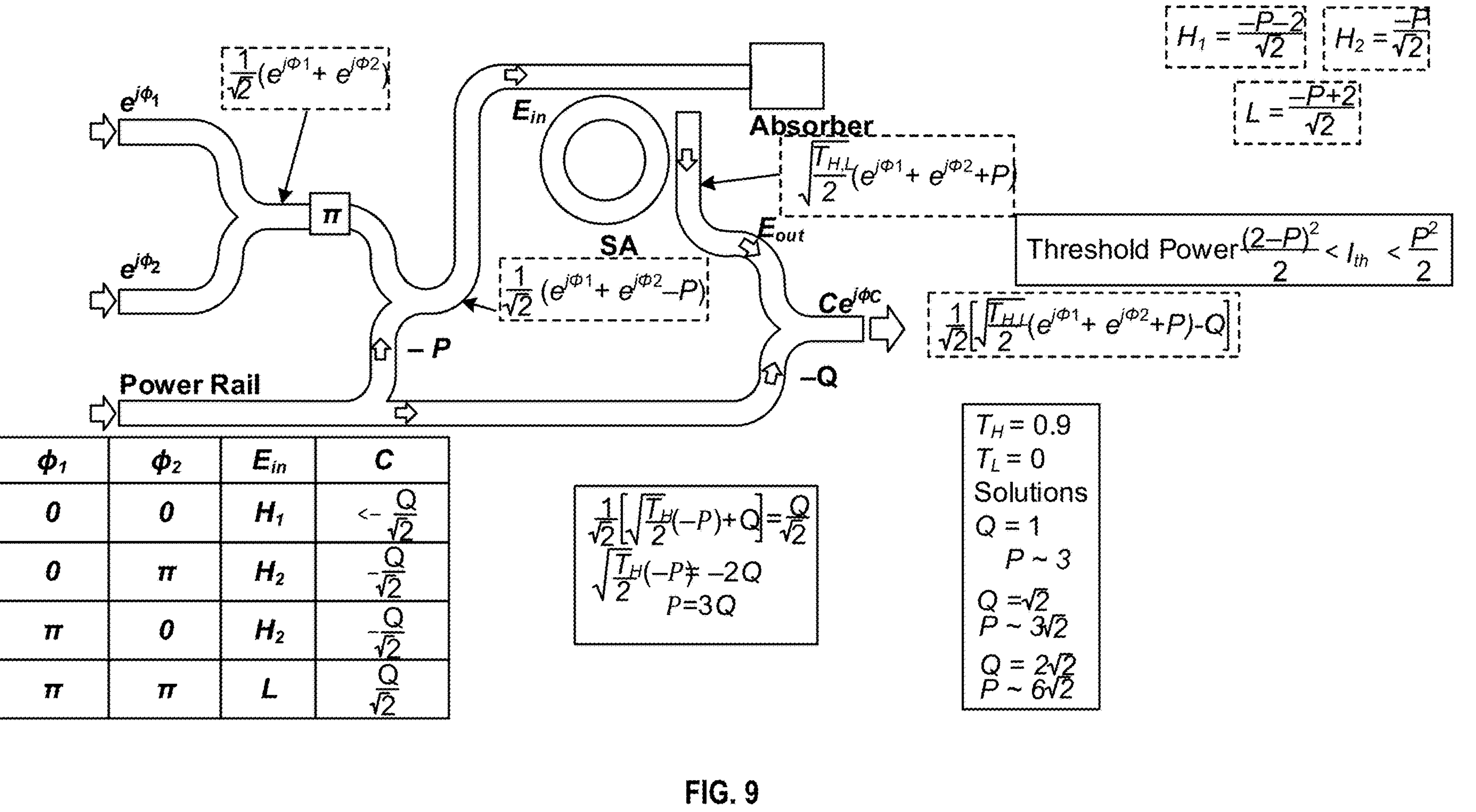
FIG. 9 illustrates an example implementation of an optical circuit along with an example truth table, in accordance with various embodiments.

FIG. 9 illustrates an example implementation of an optical circuit (e.g., the optical circuits 100, 400, 500, 600, etc.) along with an example truth table, in accordance with various embodiments. In some embodiments, shown in FIG. 9 is an example implementation of the optical circuit 600 for a logic NAND operation. As shown, when a first logic input is at a first state (e.g., "0") with a first phase $Ø_1$ of $\pi$ and a second logic input is at a second state (e.g., "0") with a second phase $Ø_2$ of 0, an optical logic output, C (=C exp(jØC)), can be provided with a first logic state (e.g., "1") with an output amplitude of $C<-Q/\sqrt{2}$. When the first logic input is at a first state (e.g., "0") with a first phase $Ø_1$ of 0 and the second logic input is at a second state (e.g., "1") with a second phase $Ø_2$ of $\pi$, the optical logic output, C (=C exp(jØC)), can be provided with the first logic state (e.g., "1") with an output amplitude of $C=-Q/\sqrt{2}$. When the first logic input is at a first state (e.g., "1") with a first phase $Ø_1$ of $\pi$ and the second logic input is at a second state (e.g., "0") with a second phase $Ø_2$ of 0, the optical logic output, C (=C exp(jØC)), can be provided with the first logic state (e.g., "1") with an output amplitude of $C=-Q/\sqrt{2}$. When the first logic input is at a first state (e.g., "1") with a first phase $Ø_1$ of $\pi$ and the second logic input is at a second state (e.g., "1") with a second phase $Ø_2$ of $\pi$, the optical logic output, C (=C exp(jØC)), can be provided with a second logic state (e.g., "0") with an output amplitude of $C=Q/\sqrt{2}$.

Figure 10:
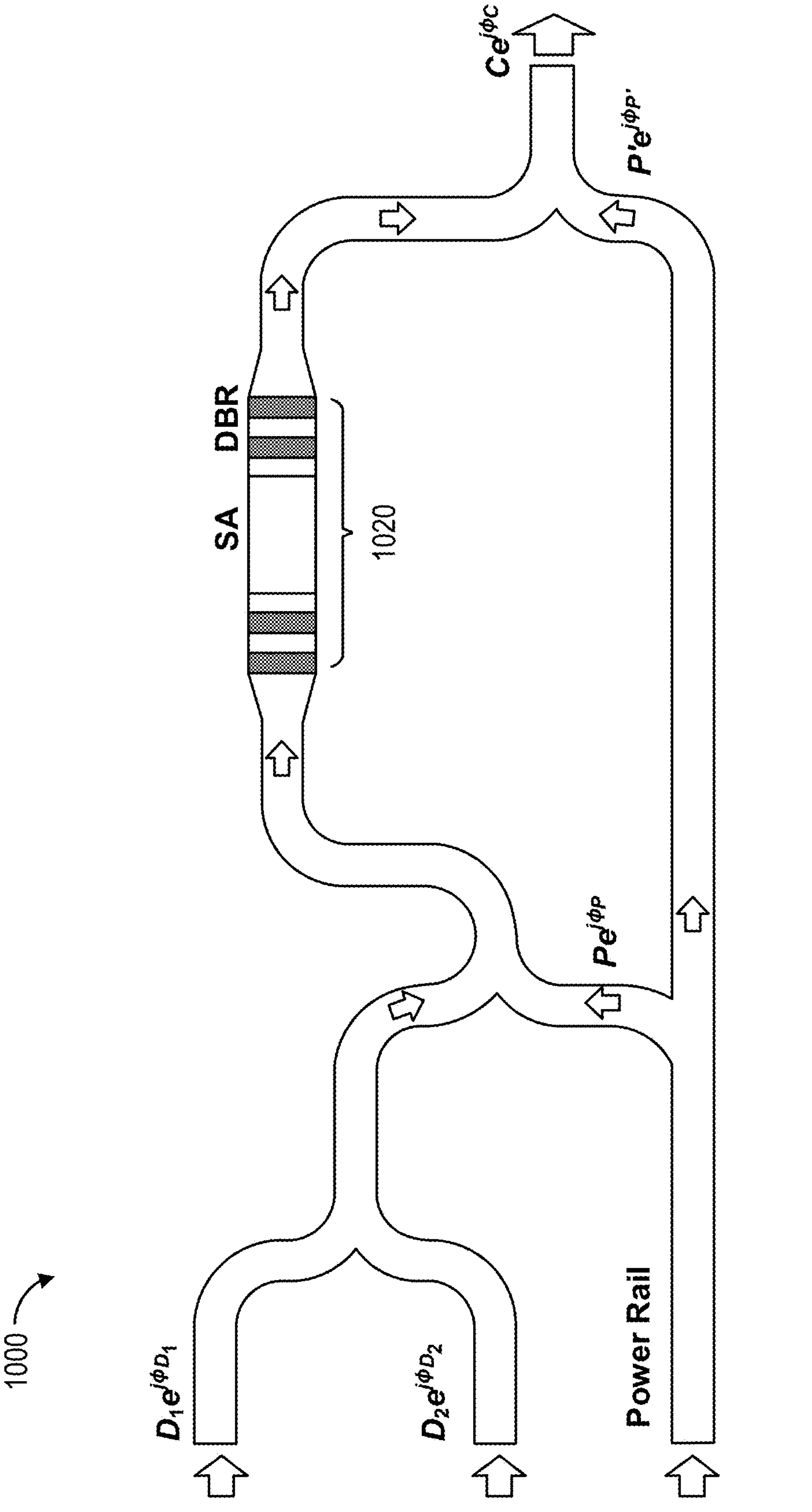
FIG. 10 illustrates a schematic diagram of an example optical circuit, in accordance with various embodiments.

The logic operations described and shown with respect to FIG. 7 to FIG. 9 are non-limiting examples, and various other logic operations can be implemented with the optical circuit disclosed herein. Although the optical circuits described with respect to FIG. 7 to FIG. 9 are shown to include an optical ring resonator, the optical circuits can include any other cavity or resonator, in some embodiments. For example, as discussed with respect to FIG. 3A, the optical circuit can include a FP resonator to perform various logic operations disclosed herein. FIG. 10 illustrates a schematic diagram of an example optical circuit 1000, in accordance with various embodiments. More specifically, shown in FIG. 10 is an example of the optical circuit 600 that includes a Fabry-Perot cavity 1020, alternatively as opposed to the optical circuit 600 of FIG. 6.

As discussed above, in some embodiments, the output logic state of the optical logic output can be a result of a logic operation determined based on an amplitude of the optical logic output. In some embodiments, the output logic state of the optical logic output can be a result of a logic operation determined based on a phase of the optical logic output. That is, the optical circuits can be configured to perform such logic operations by configuring a phase of the optical logic output. FIG. 11 illustrates an example truth table associated with an optical circuit (e.g., the optical circuit 600), in accordance with various embodiments. More specifically, shown in the table is an example implementation of the optical circuit configured to perform a logic OR operation based on a phase of the optical logic output.

As shown, when a first logic input is at a first state (e.g., "0") with a first phase $Ø_1$ of 0 and a second logic input is at a second state (e.g., "0") with a second phase $Ø_2$ of 0, an optical logic output, C (=C exp(jØC)), can be provided with a first logic state (e.g., "0") with an output phase of ØC=0. When the first logic input is at a first state (e.g., "0") with a first phase $Ø_1$ of 0 and the second logic input is at a second state (e.g., "1") with a second phase $Ø_2$ of $\pi$, the optical logic output, C (=C exp(jØC)), can be provided with a second logic state (e.g., "1") with an output phase of ØC=$\pi$. When the first logic input is at a first state (e.g., "1") with a first phase $Ø_1$ of $\pi$ and the second logic input is at a second state (e.g., "0") with a second phase $Ø_2$ of 0, the optical logic output, C (=C exp(jØC)), can be provided with the second logic state (e.g., "1") with an output phase of ØC=$\pi$. When the first logic input is at a first state (e.g., "1") with a first phase $Ø_1$ of $\pi$ and the second logic input is at a second state (e.g., "1") with a second phase $Ø_2$ of $\pi$, the optical logic output, C (=C exp(jØC)), can be provided with the second logic state (e.g., "1") with an output phase of ØC=$\pi$.

Figure 12:
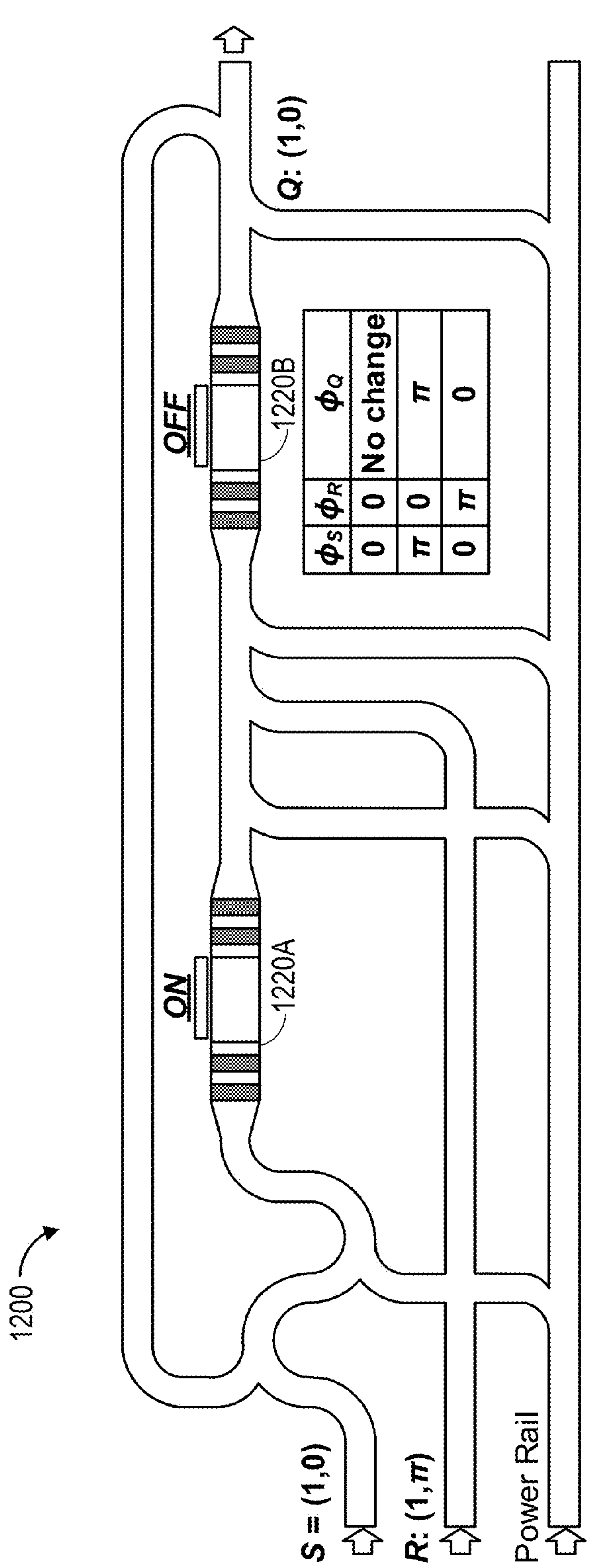
FIG. 12 illustrates a schematic diagram of an example optical circuit along with an associated truth table, in accordance with various embodiments.

The optical circuits and/or at least one component thereof disclosed herein can be coupled, arranged, or otherwise configured in various manners to perform logic operations. In some embodiments, the optical circuit or a component (e.g., the resonator) thereof can be optically coupled with another optical circuit or another component. In some embodiments, the optical circuit includes a first resonator and a second resonator optically coupled with the first resonator in series or parallel. The optical circuit can thereby perform various logic operations based on the coupled resonators, etc. FIG. 12 illustrates a schematic diagram of an example optical circuit 1200 along with an associated truth table, in accordance with various embodiments. In some embodiments, the optical circuit 1200 may be substantially similar to or incorporate features of the optical circuits 100, 400, 500, 600, 1000, etc. For example, the optical circuit 1200 includes a first resonator 1220A, and additionally a second resonator 1220B. The optical circuit 1200 shown in FIG. 12 is simplified for illustrative purposes, and thus, can be implemented as any of various other configurations while remaining within the scope of the present disclosure. In some examples, the optical circuit 1200 can include more, fewer, or different components than shown in the figure.

In some embodiments, the second resonator 1220B can be optically coupled to an output of the first resonator 1220A, as shown. For example, the second resonator 1220B can be configured to receive an optical output signal of the first resonator 1220A. Although not shown, an input of the first resonator 1220A and an input of the second resonator 1220B can be optically coupled with each other such that the first resonator 1220A and the second resonator 1220B can receive a same input signal. In some embodiments, although shown to include two FP resonators, the optical circuit 1200 can include a ring resonator and a FP resonator, etc.

Based on the coupled resonators (e.g., the first resonator 1220A, the second resonator 1220B), the optical circuits (e.g., the optical circuit 1200) can be configured to perform various logic operations. Shown in FIG. 12 is the logic circuit 1200 configured to perform a flip-flop and/or latching operation. The optical circuit 1200 can receive a first logic input S, a second logic input R, and a reference signal. Based at least on the first logic input S, the second logic input R, and the reference signal, the first resonator 1220A is configured to encode a first state. For example, the first state can correspond to a first logic state (e.g., "0" or "OFF") (when the first resonator 1220A does not transmit its optical input signal and/or when the optical input signal has an intensity below an intensity threshold) or a second logic state (e.g., "1" or "ON" as shown) (when the first resonator 1220A transmits its optical input signal and/or when the optical input signal has an intensity above the intensity threshold). Based at least on the first logic input S, the second logic input R, and the reference signal, the second resonator 1220B is configured to encode a second state. For example, the second state can correspond to a first logic state (e.g., "0" or "OFF" as shown) (when the second resonator 1220B does not transmit its optical input signal and/or when the optical input signal has an intensity below an intensity threshold) or a second logic state (e.g., "1" or "ON") (when the second resonator 1220B transmits its optical input signal and/or when the optical input signal has an intensity below the intensity threshold). The optical circuit 1200 can be configured to provide an optical logic output Q, based on the operation of the first resonator 1220A and the second resonator 1220B, thereby performing a flip-flop operation. As shown in the truth table, for example, when the first logic input S has a first phase of 0, and the second logic input R has a second phase of 0, the optical logic output Q has an output phase with no change (that is, no change in a logic state). When the first logic input S has the first phase of π, and the second logic input R has the second phase of 0, the optical logic output Q has the output phase with π (that is, setting a logic state to a first output logic state (e.g., "1")). When the first logic input S has the first phase of 0, and the second logic input R has the second phase of π, the optical logic output Q has the output phase with 0 (that is, setting a logic state to a second output logic state (e.g., "0")).

In some embodiments, the optical circuit 1200 can be configured to function as an AND-OR flip-flop circuit, in which a bit can be stored based on resonator operations. For example, the first resonator 1220A can be an optical AND gate, and the second resonator 1220B can be an optical OR gate. This allows the optical circuit 1200 to form an optical memory device. For example, the optical circuit 1200 can be configured to function as an optical SRAM Static Random-Access Memory (SRAM). The bit can be stored in a saturated state of the flip-flop, in which one gate is ON, while the other is OFF, or vice-versa. Without any bistable resonator state or intervening electronic capacitance, like an electronic SRAM, the optical circuit 1200 can be configured to hold a logic state provided the reference signal (e.g., the power rails are energized).

Furthermore, the optical circuit 1200 configured as a logic circuit (e.g., an AND-OR flip-flop) can achieve functionalities, such as fanout, lack of critical biasing, input/output isolation, cascadability, low power, high speed, etc. for practical application. In some embodiments, the output level and phase can be reset by the reference signal at each gate output. In some embodiments, input/output isolation can be achieved by incorporating an absorber. In some embodiments, cascadability and fanout can be achieved via coherent pump coupling. In some embodiments, an output contrast ratio can be utilized to avoid critical biasing. In addition, the use of an optical signal allows for high speed configuration while reducing the gate power consumption. This can thereby enable transformative computing architectures that benefit fundamentally in speed and energy consumption by maintaining data in the optical domain.

Figure 13:
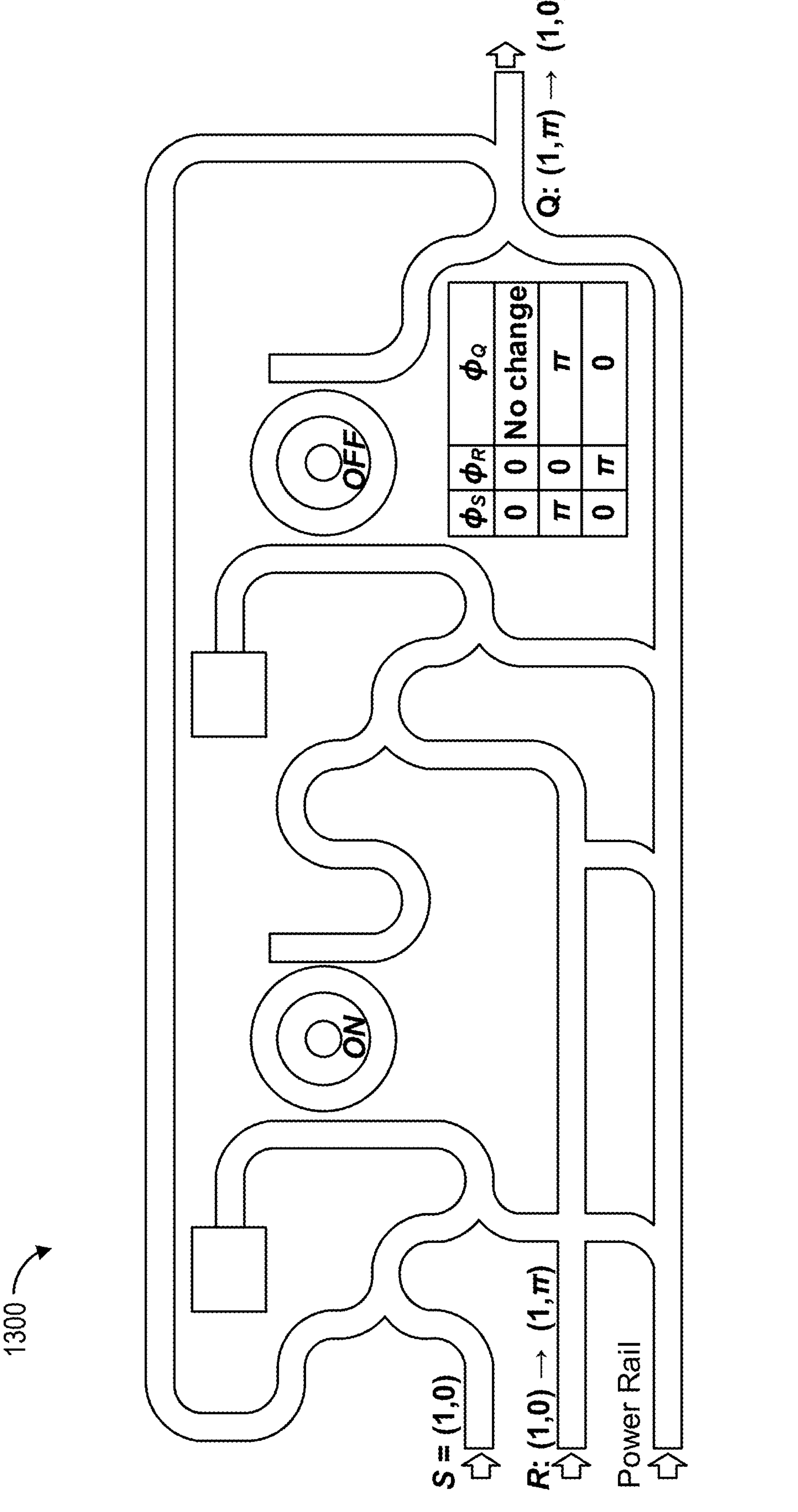
FIG. 13 illustrates a schematic diagram of an example optical circuit along with an associated truth table, in accordance with various embodiments.

As discussed above, the optical circuit 1200 can include various other components alternatively and/or additionally, for example, a ring resonator. FIG. 13 illustrates a schematic diagram of an example optical circuit 1300 along with an associated truth table, in accordance with various embodiments. In some embodiments, the optical circuit 1300 may be substantially similar to or incorporate features of the optical circuits 100, 400, 500, 600, 1000, 1200, etc. For example, the optical circuit 1300 includes ring resonators, alternatively as opposed to the optical circuit 1200.

Figure 14:
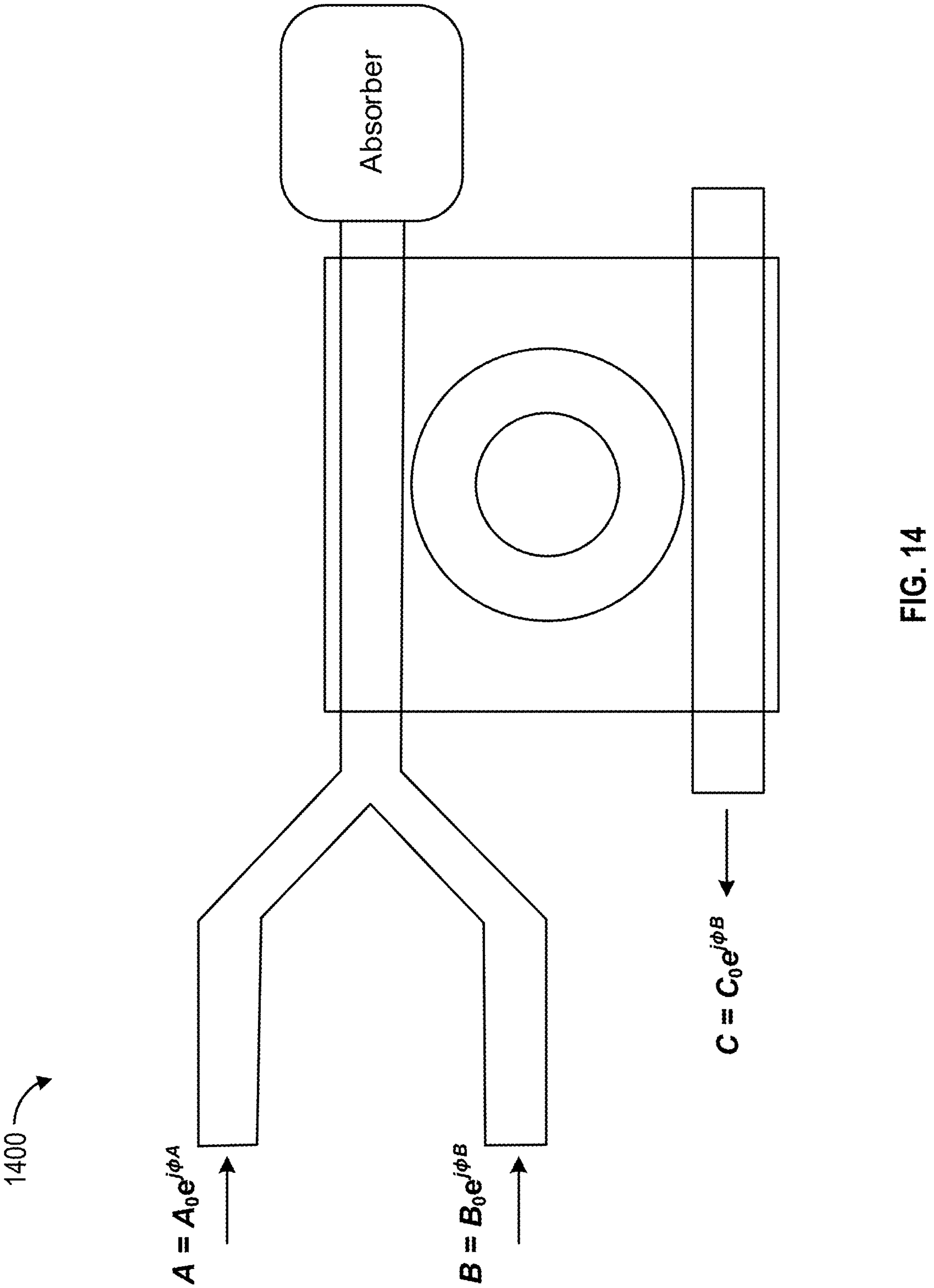
FIG. 14 illustrates a schematic diagram of an example optical circuit, in accordance with various embodiments.

Referring now to FIG. 14, in some embodiments, the optical circuits disclosed herein can omit one or more components. FIG. 14 illustrates a schematic diagram of an example optical circuit 1400, in accordance with various embodiments. In some embodiments, the optical circuit 1400 may be substantially similar to or incorporate features of the optical circuits 100, 400, 500, 600, 1000, 1200, 1300, etc. For example, the optical circuit 1400 is configured to function as an optical AND gate while omitting an optical reference path, as opposed to the optical circuit 100 of FIG. 1. The optical circuit 1400 shown in FIG. 14 is simplified for illustrative purposes, and thus, can be implemented as any of various other configurations while remaining within the scope of the present disclosure. In some examples, the optical circuit 1400 can include more, fewer, or different components than shown in the figure.

Figure 15:
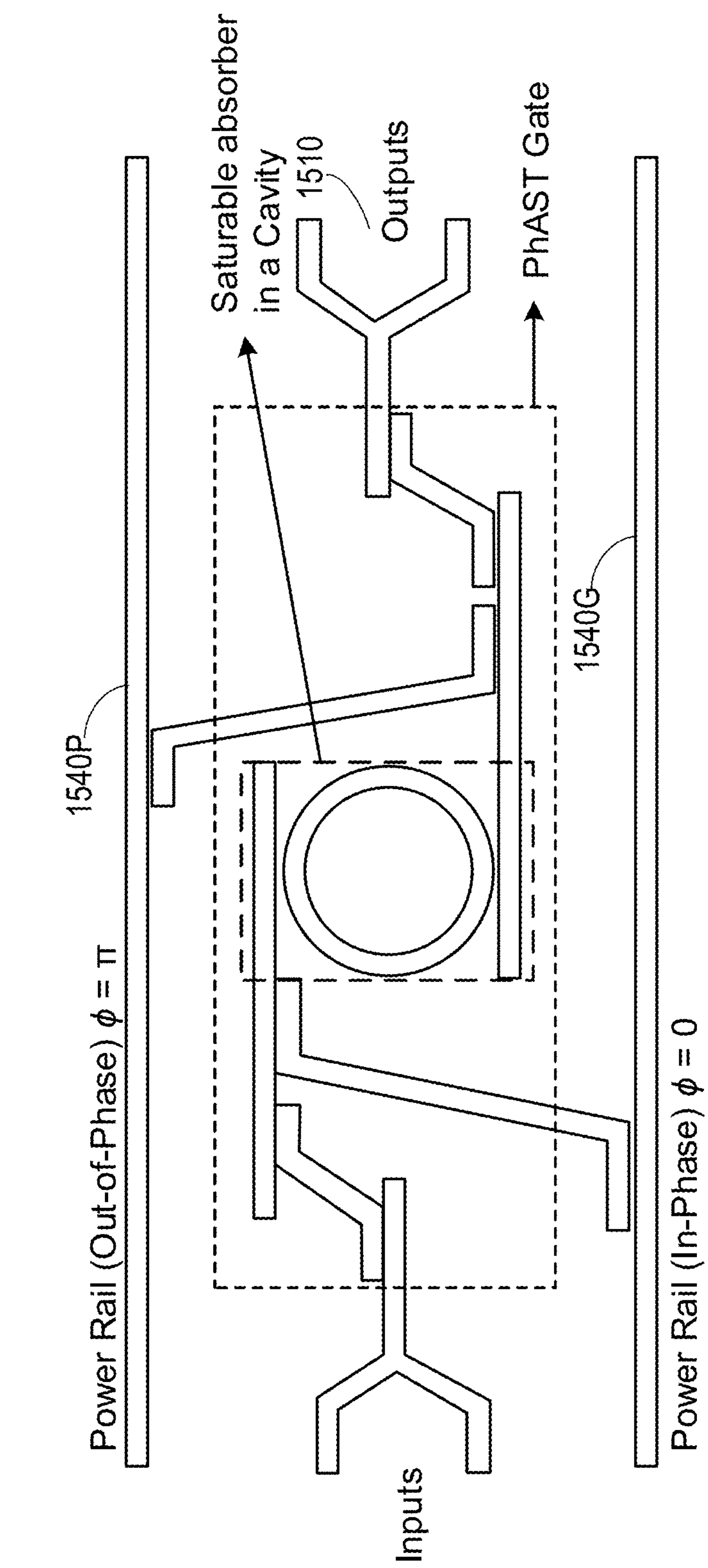
FIG. 15 illustrates a schematic diagram of an example optical circuit, in accordance with various embodiments.

FIG. 15 illustrates a schematic diagram of an example optical circuit 1500, in accordance with various embodiments. In some embodiments, the optical circuit 1500 may be substantially similar to or incorporate features of the optical circuits 100, 400, 500, 600, 1000, 1200, 1300, etc. For example, the optical circuit 1500 includes a plurality of logic input paths, an optical input path, a resonator, an optical output path, an optical reference path, etc. The optical circuit 1500 is shown to include a fanout component 1510 additionally. The optical circuit 1500 shown in FIG. 15 is simplified for illustrative purposes, and thus, can be implemented as any of various other configurations while remaining within the scope of the present disclosure. In some examples, the optical circuit 1500 can include more, fewer, or different components than shown in the figure.

In some embodiments, as shown, the fanout component 1510 can be optically coupled to an output of the resonator. In some embodiments, the fanout component 1510 can be configured to provide an optical logic output to a plurality of fanout paths. For example, as shown, the fanout component 1510 can include two fanout paths, to which the optical circuit 1500 can provide a first optical logic output and a second optical logic output.

In some embodiments, as shown, a first optical reference path 1540P is optically coupled to an output of the resonator, while a second optical reference path 1540G is optically coupled to an input of the resonator. The first optical reference path 1540P can provide a first reference signal having a first phase of π (or an out-of-phase signal) and couple to the output of the resonator. The second optical reference path 1540G can provide a second reference signal having a second phase of 0 (or an in-phase signal) and couple to the input of the resonator.

This coupling of the reference signals to the input and output of the resonator enables the fanout component 1510 to provide the optical logic output(s) with the fanout-of-2 for practical digital circuitry. For example, a coherent coupling of data signals with the photonic "power rails" (e.g., the first reference path 1540P, the second reference path 1540G, etc.) allows for gate-level gain for fanout (e.g., for level restoration) and cascadability while acting as a coherent power source for each gate to enable high circuit density and complexity. Adding such a reference signal allows the nonlinear response of the SA to achieve gain (e.g., high enough for a fanout). This allows for various operations including encoding of a logic state by controlling the phases of the reference signals.

Figure 16:
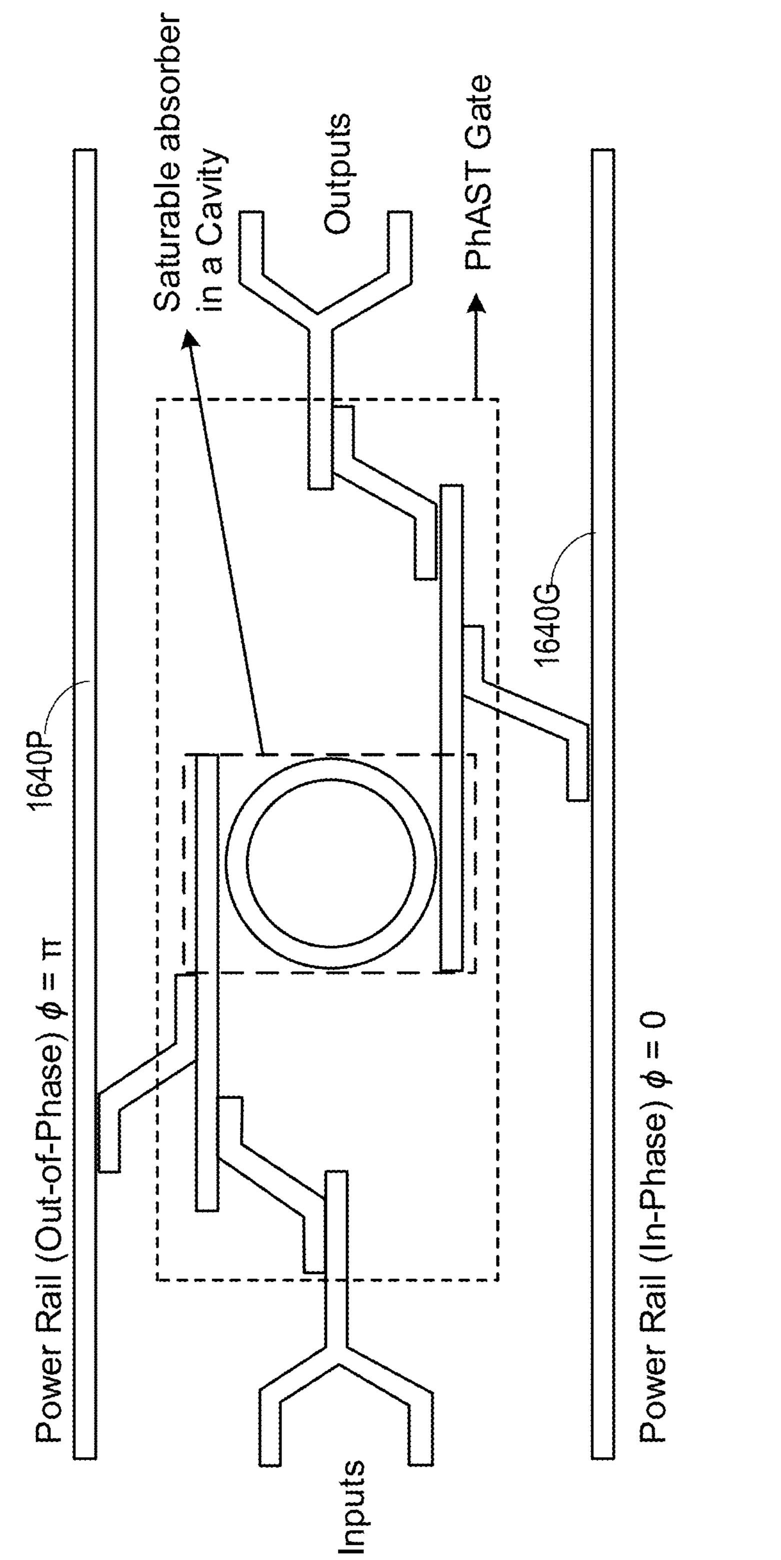
FIG. 16 illustrates a schematic diagram of an example optical circuit, in accordance with various embodiments.

The coupling of the reference signals is not limited to the optical circuit 1500 of FIG. 5, and can be implemented in various manners without departing from the scope and spirit. FIG. 16 illustrates a schematic diagram of an example optical circuit 1600, in accordance with various embodiments. In some embodiments, the optical circuit 1600 may be substantially similar to or incorporate features of the optical circuits 100, 400, 500, 600, 1000, 1200, 1300, 1500, etc. For example, the optical circuit 1600 includes a first reference path 1640P coupled to an input of a resonator, a second reference path 1640G coupled to an output of the resonator, etc., alternatively as opposed to the optical circuit 1500. The optical circuit 1600 shown in FIG. 16 is simplified for illustrative purposes, and thus, can be implemented as any of various other configurations while remaining within the scope of the present disclosure. In some examples, the optical circuit 1600 can include more, fewer, or different components than shown in the figure.

Figure 17B:
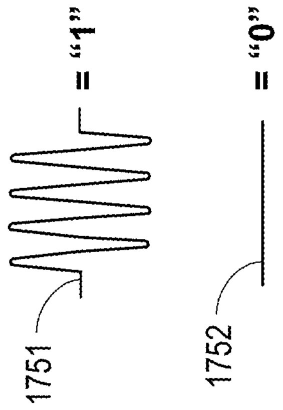
FIG. 17B illustrates an example of waveforms associated with an optical circuit, in accordance with various embodiments.
Figure 17A:
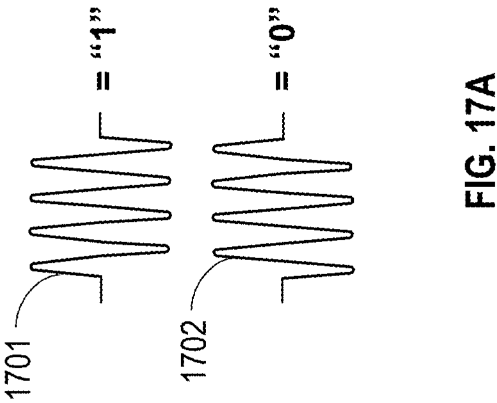
FIG. 17A illustrates an example of waveforms associated with an optical circuit, in accordance with various embodiments.

The optical circuits as discussed herein can operate based on various signal configurations. In some embodiments, as discussed above (e.g., with respect to FIG. 6), the optical circuit can operate based on data inputs D1 (=$D_1$ exp(j$Ø_{D1}$)) and D2 (=$D_2$ exp(j$Ø_{D2}$)) to provide an output of C (=C exp(jØC)). The optical circuits can serve as a logic circuit as discussed herein while accommodating various forms of these data inputs. FIG. 17A illustrates an example of waveforms 1701, 1702 associated with an optical circuit, in accordance with various embodiments. In some embodiments, the waveforms 1701, 1702 are associated with the logic circuits 100, 400, 500, 600, 1000, 1200, 1300, 1500, 1600, etc. For example, the waveform 17$Ø_1$ is of a first logic input having a first logic state (e.g., "1") of the optical circuit, and the waveform 1702 is of a second logic input having a second logic state (e.g., "0") of the optical circuit. As shown, the difference in logic state can be achieved by providing different phases in the first logic input and the second logic input. This configuration can be sometimes referred to as Binary Phase Shift Keying (BPSK). FIG. 17B illustrates an example of waveforms 1751, 1752 associated with an optical circuit, in accordance with various embodiments. In some embodiments, the waveforms 1751, 1752 are associated with the logic circuits 100, 400, 500, 600, 1000, 1200, 1300, 1500, 1600, etc. For example, the waveform 1751 is of a first logic input having a first logic state (e.g., "1") of the optical circuit, and the waveform 1752 is of a second logic input having a second logic state (e.g., "0") of the optical circuit. In some embodiments, as shown, the difference in logic state can be achieved by setting a logic input to have a substantially-zero (or zero) input (or a constant-amplitude input). That is, the substantially-zero (or zero) input can be configured to serve as a logic state of a logic input. For example, logic inputs may be formed of a first optical signal having a non-zero amplitude (e.g., the waveform 1751) and/or a second optical signal having a substantially-zero (or zero) amplitude (e.g., D1=0). This configuration can simplify the logic signal configurations while reducing power consumption on the input side. This configuration can be sometimes referred to as Coherent Shift Keying (C-ASK).

Figure 18A:
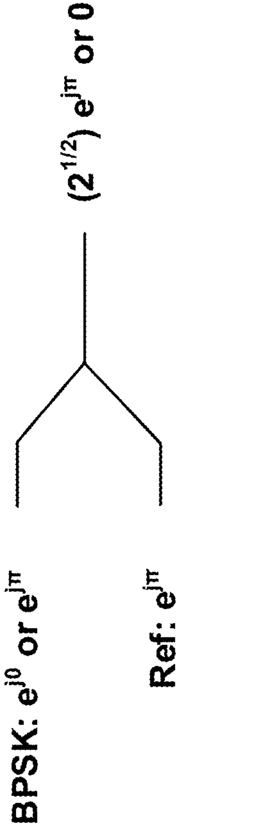
FIG. 18A illustrates an example implementation of BPSK configuration, in accordance with various embodiments.

Based on the configuration discussed above, the optical circuits disclosed herein can be configured to perform various logic operations. FIG. 18A illustrates an example implementation of the BPSK configuration, in accordance with various embodiments. In some embodiments, the BPSK configuration of FIG. 18A can be implemented using the optical circuits disclosed herein (e.g., the optical circuit 100). The configuration shown in FIG. 18A is a non-limiting example. The configuration shown in FIG. 18A is simplified for illustrative purposes, and thus, can be implemented as any of various other configurations while remaining within the scope of the present disclosure.

In the BPSK configuration, an optical logic input (e.g., the optical logic input 171) can be given as $e^{j0}$ or $e^{j\pi}$, while a reference signal (e.g., the first reference signal 141) is given as $e^{j\pi}$. For example, when a first logic input (e.g., the first logic input 581) and a second logic input (e.g., the first logic input 582) are in phase, the optical logic input can be given as $e^{j0}$, which encodes a first logic state. When the first logic input and the second logic input are out of phase, the optical logic input can be given as $e^{j\pi}$, which encodes a second logic state. Then the optical logic input ($e^{j0}$ or $e^{j\pi}$) can be combined with the reference signal to generate an optical input signal (e.g., the optical input signal 173), which can be given as $2^{1/2}e^{j\pi}$ or 0.

Figure 18B:
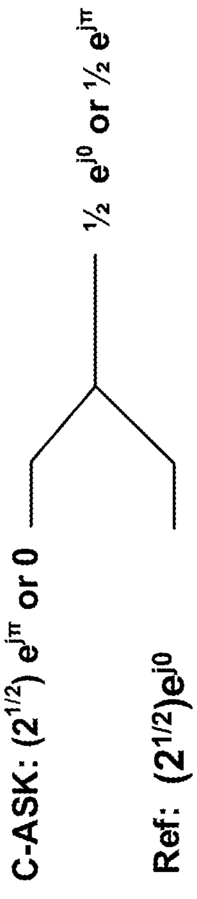
FIG. 18B illustrates an example implementation of C-ASK configuration, in accordance with various embodiments.

FIG. 18B illustrates an example implementation of the C-ASK configuration, in accordance with various embodiments. In some embodiments, the C-ASK configuration of FIG. 18B can be implemented using the optical circuits disclosed herein (e.g., the optical circuit 100). The configuration shown in FIG. 18B is a non-limiting example. The configuration shown in FIG. 18B is simplified for illustrative purposes, and thus, can be implemented as any of various other configurations while remaining within the scope of the present disclosure.

In the C-ASK configuration, an optical logic input (e.g., the optical logic input 171) can be given as $(2^{1/2})e^{j\pi}$ or 0, while a reference signal (e.g., the first reference signal 141) is given as $(2^{1/2})e^{j0}$. For example, when a first logic input (e.g., the first logic input 581) and a second logic input (e.g., the first logic input 582) are in phase, the optical logic input can be given as $(2^{1/2})e^{j\pi}$, which encodes a first logic state. When the first logic input and the second logic input are out of phase, the optical logic input can be given as 0, which encodes a second logic state. Then the optical logic input ($2^{1/2}e^{j\pi}$ or 0) can be combined with the reference signal to generate an optical input signal (e.g., the optical input signal 173), which can be given as $1/2e^{j0}$ or $1/2e^{j\pi}$.

Figure 19A:
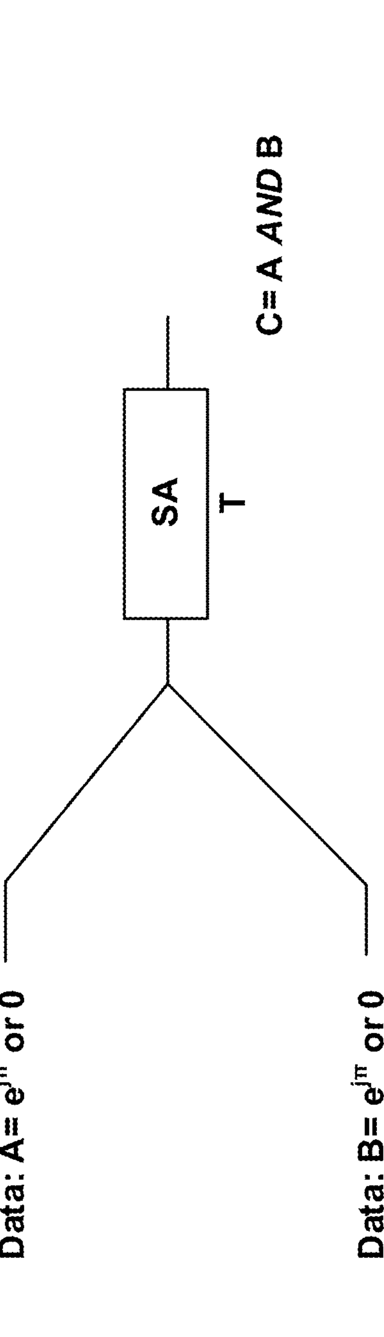
FIG. 19A illustrates an example implementation of C-ASK configuration, in accordance with various embodiments.
Figure 19B:
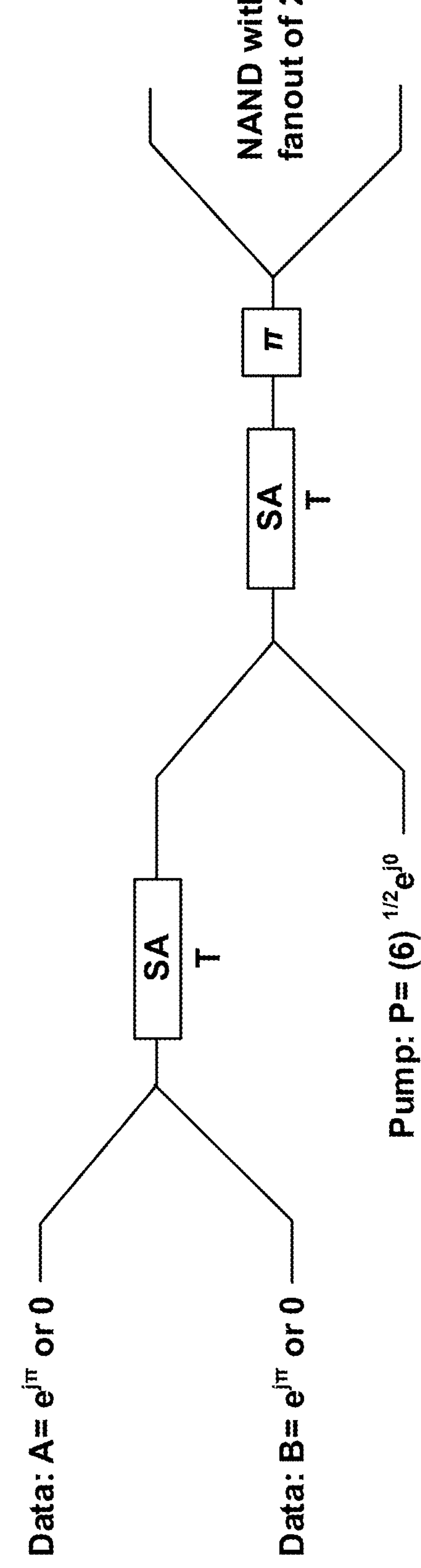
FIG. 19B illustrates an example implementation of C-ASK configuration, in accordance with various embodiments.

FIG. 19A illustrates an example implementation of the C-ASK configuration, in accordance with various embodiments. FIG. 19B illustrates an example implementation of the C-ASK configuration, in accordance with various embodiments. More specifically, shown in FIG. 19A is an example logic AND operation based on the C-ASK configuration. Shown in FIG. 19B is an example logic NAND operation based on the C-ASK configuration, along with a fanout of 2. In some embodiments, the C-ASK configuration shown in the figures can be implemented using the optical circuits disclosed herein (e.g., the optical circuit 100). The configuration shown in the figures is a non-limiting example. The configuration shown in the figures is simplified for illustrative purposes, and thus, can be implemented as any of various other configurations while remaining within the scope of the present disclosure. While the logic AND operation and the NAND operation are shown as non-limiting examples, the C-ASK configuration can be implemented using the optical circuit disclosed herein, to perform various logic operations, including but not limited to, logic operations of AND, OR, NOT, NAND, NOR, XOR, XNOR, flip flop, modulation, demodulation, etc.

The optical circuits disclosed herein can be configured to perform modulation, demodulation, signal processing, etc.

Figure 20:
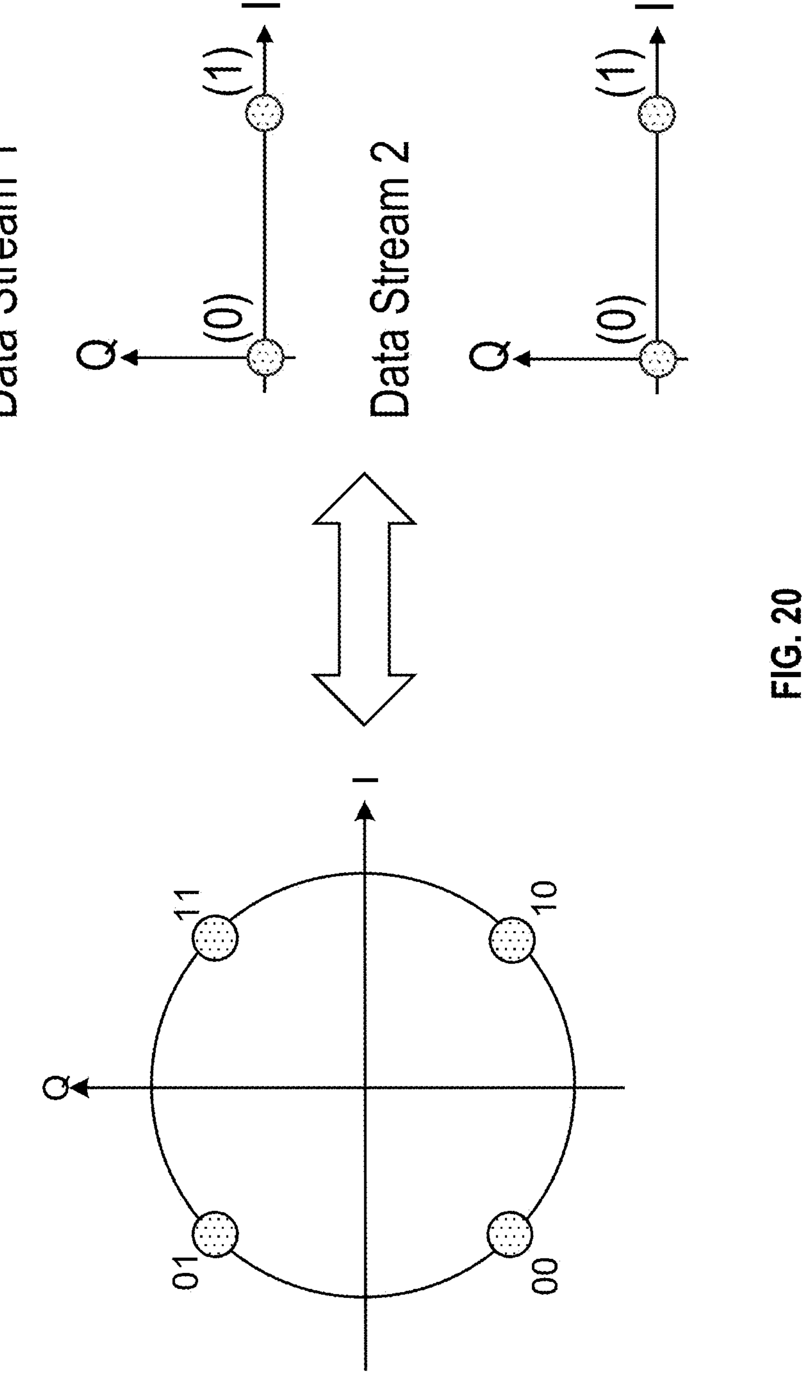
FIG. 20 illustrates an example implementation of an optical circuit, in accordance with various embodiments.

FIG. 20 illustrates an example implementation of an optical circuit, in accordance with various embodiments. More specifically, shown in FIG. 20 is a conversion of an optical signal (e.g., modulation, demodulation, etc.) between Binary Phase Shift Keying (BPSK) and Quaternary Phase Shift Keying (QPSK). The implementation shown in FIG. 20 is a non-limiting example. The implementation shown in FIG. 20 is simplified for illustrative purposes, and thus, can be implemented as any of various other configurations while remaining within the scope of the present disclosure. In some embodiments, the optical circuits disclosed herein can be configured to convert (and/or demodulate) a higher order signal into binary signals (e.g., as discussed with respect to FIG. 21). In some embodiments, the optical circuits disclosed herein can be configured to convert (and/or modulate) binary signals into a higher order signal (e.g., as discussed with respect to FIG. 22).

Figure 21:
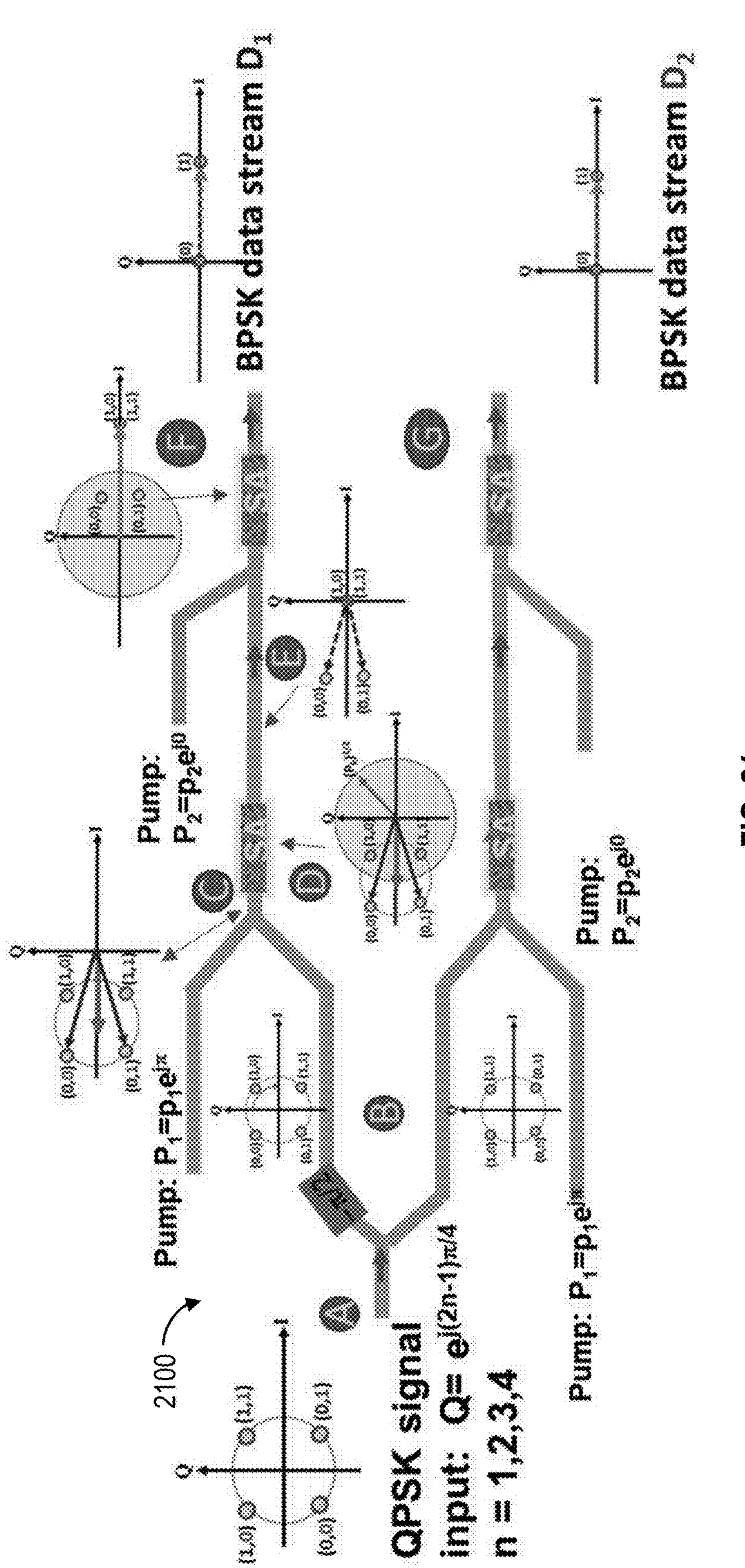
FIG. 21 illustrates an example implementation of an optical circuit, in accordance with various embodiments.

FIG. 21 illustrates an example implementation of an optical circuit 2100, in accordance with various embodiments. More specifically, shown in FIG. 21 is the optical circuit 2100 configured to convert (and/or demodulate) a higher order signal into binary signals. In some embodiments, the optical circuit 2100 may be substantially similar to or incorporate features of the optical circuit 100, etc. The optical circuit 2100 shown in FIG. 21 is simplified for illustrative purposes, and thus, can be implemented as any of various other configurations while remaining within the scope of the present disclosure. In some examples, the optical circuit 2100 can include more, fewer, or different components than shown in the figure.

In some embodiments, the optical circuit 2100 can be configured to receive a QPSK signal input Q and demodulate into a set of data signals (e.g., BPSK data stream D1, BPSK data stream D2, etc.). In some embodiments, the QPSK signal input Q has a constellation as shown. In some embodiments, each of the BPSK data streams D1, D2 can have a bit rate equal to a symbol rate of the input.

At point A, the optical circuit 2100 can receive the QPSK signal input. At point B, the optical circuit 2100 can split the QPSK signal input into a first signal and a second signal. In some embodiments, the optical circuit 2100 can include a splitter configured to QPSK signal into the two signals. For example, a splitter having a 50:50 ratio can be used. One of the first input signal and the second input signal is phase-shifted by $\pi/2$, which rotates the constellation as shown. At point C, the split input signal each receives a reference signal (e.g., a coherent pump signal $P_1$), which shifts the constellation to left as shown. At point D, each of two resonators can allow two corresponding symbols of the QPSK signals, thereby resulting two of the output symbols at Point E. At point F, a second reference signal can be provided, which shifts the two signals as depicted. At point G, the optical circuit 2100 can output BPSK-encoded signals. In some embodiments, as discussed herein, the optical circuit 2100 can be configured to manipulate (e.g., demodulate) a phase and/or an amplitude of the input constellation (e.g., by phase shifts, addition of reference signals, etc.). In some embodiments, the optical circuit 2100 can be configured to filter, select, or otherwise manipulate the demodulated data streams. In some embodiments, although shown to be implemented for the QPSK signal, the optical circuit 2100 can be configured to convert (and/or demodulate) a higher order signal into binary signals.

Figure 22:
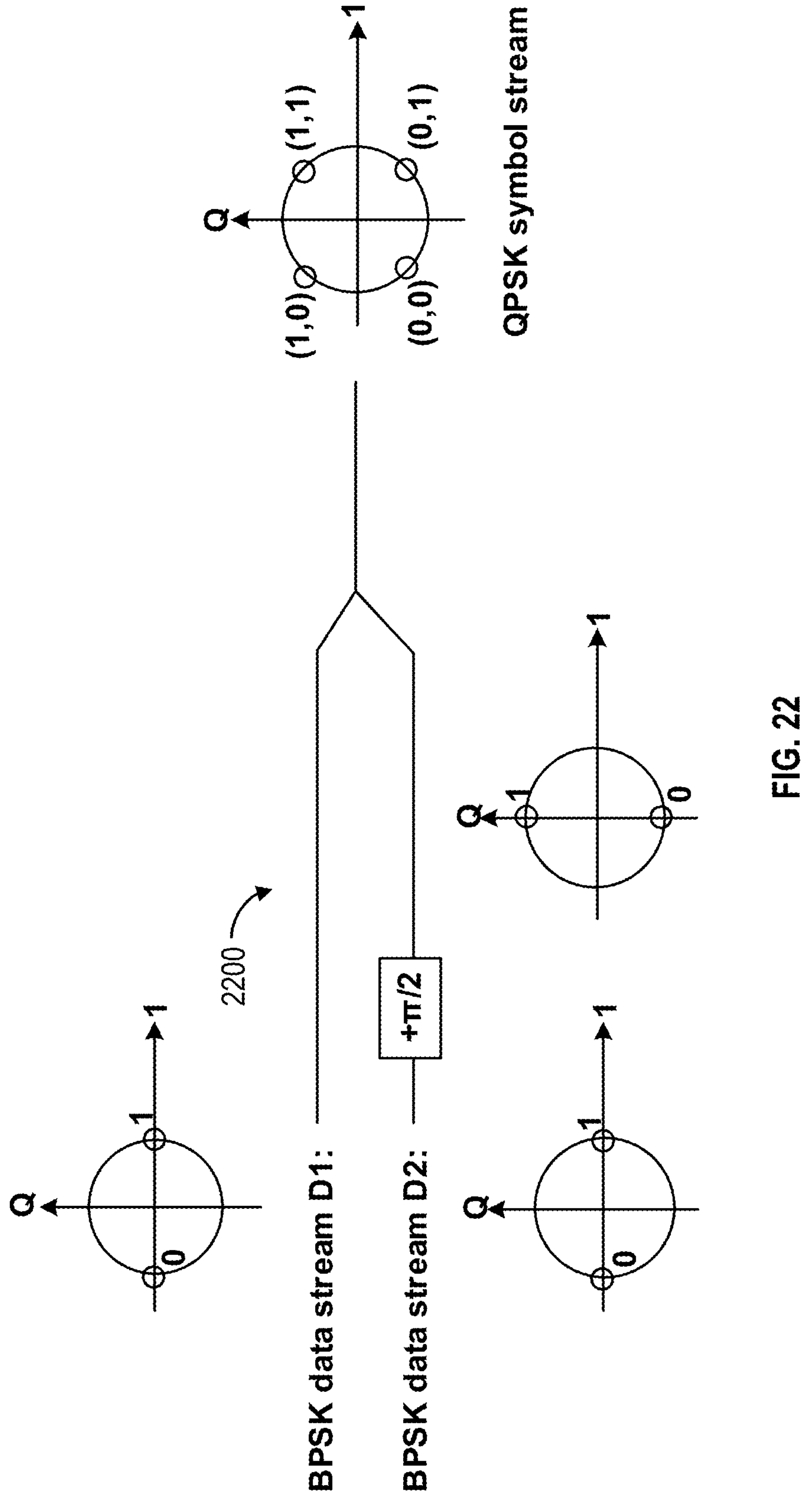
FIG. 22 illustrates an example implementation of an optical circuit, in accordance with various embodiments.

FIG. 22 illustrates an example implementation of an optical circuit 2200, in accordance with various embodiments. More specifically, shown in FIG. 22 is the optical circuit 2200 configured to convert (and/or modulate) binary signals into a higher order signal. In some embodiments, the optical circuit 2200 may be substantially similar to or incorporate features of the optical circuit 100, etc. The optical circuit 2200 shown in FIG. 22 is simplified for illustrative purposes, and thus, can be implemented as any of various other configurations while remaining within the scope of the present disclosure. In some examples, the optical circuit 2200 can include more, fewer, or different components than shown in the figure.

In some embodiments, the optical circuit 2200 can be configured to data streams (e.g., BPSK signals encoded in the optical domain) into a higher order signal (e.g., QPSK). (e.g., BPSK data streams D1, D2). For example, as shown, the BPSK data streams can be optical signals having a first state (e.g., "1," $e^{i0}$, etc.) or a second state (e.g., "0," $e^{i\pi}$, etc.). The optical circuit 2200 can modulate the BPSK-encoded signals into a QPSK signal, as shown. In some embodiments, the optical circuit 2200 can be configured to sum the two BPSK signals to generate the QPSK signal. In some embodiments, the optical circuit 2200 can shift a phase of one of the two BPSK signals (e.g., by $\pi$) to generate the QPSK signal.

Figure 23:
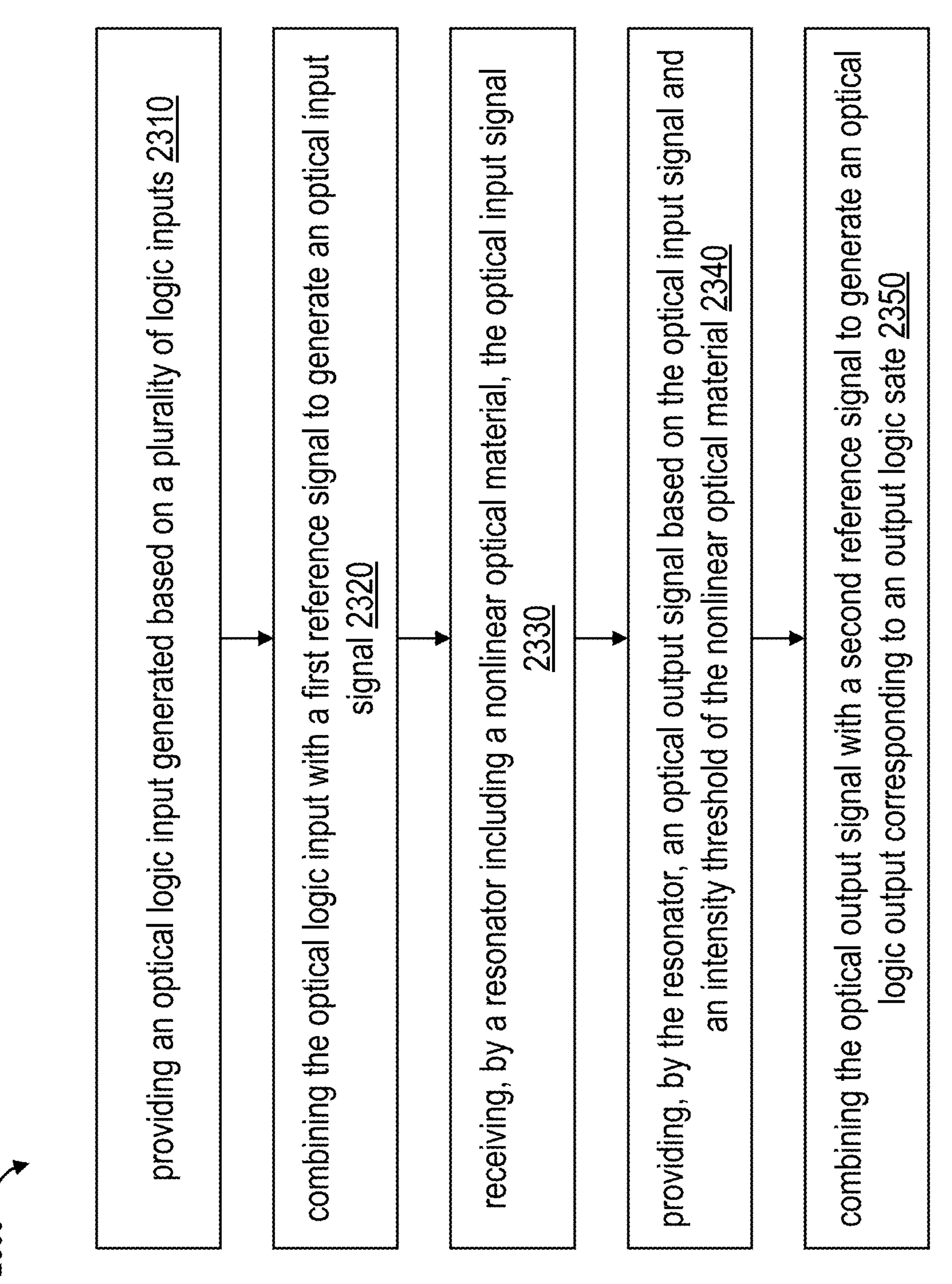
FIG. 23 illustrates a flow chart of an example method, in accordance with various embodiments.

FIG. 23 illustrates a flow chart of an example method 2300, in accordance with various embodiments. In some embodiments, the method 2300 may be a method for operating an optical circuit (e.g., the optical circuit 100, etc.). For example, at least one operation in the method 2300 can be used to operate an optical circuit or at least a portion thereof. It is noted that the method 2300 is a non-limiting example. Accordingly, it should be understood that additional operations may be provided before, during, and/or after the method 2300 of FIG. 23, and that some other operations may be briefly described herein. In some embodiments, the method 2300 can include more, fewer, or different operations than shown in FIG. 23.

In a brief overview, the method 2300 begins with operation 2310 of providing an optical logic input generated based on a plurality of logic inputs. The method 2300 continues to operation 2320 of combining the optical logic input with a first reference signal to generate an optical input signal. The method 2300 continues to operation 2330 of receiving, by a resonator including a nonlinear optical material, the optical input signal. The method 2300 continues to operation 2340 of providing, by the resonator, an optical output signal based on the optical input signal and an intensity threshold of the nonlinear optical material. The method 2300 continues to operation 2350 of combining the optical output signal with a second reference signal to generate an optical logic output corresponding to an output logic sate.

At operation 2310, an optical logic input (e.g., the optical logic input 171) is provided. In some embodiments, the optical logic input can be generated based on a plurality of logic inputs (e.g., the first logic input 581, the second logic input 582, etc.). At operation 2320 the optical logic input can be combined with a first reference signal (e.g., the first reference signal 141) to generate an optical input signal (e.g., the optical input signal 173). In some embodiments, the method 2300 can include coupling, through an optical coupler or combiner, the optical logic input with the first reference signal.

At operation 2330, the method 2300 includes a resonator (e.g., the resonator 120), including a nonlinear optical material (e.g., the nonlinear optical material 125), receiving the optical input signal. In some embodiments, an input of the resonator can be optically coupled to the optical input signal.

At operation 2340, the method 2300 includes the resonator providing an optical output signal (e.g., the optical output signal 175). In some embodiments, the resonator can provide the optical output signal based on the optical input signal and an intensity threshold of the nonlinear optical material.

At operation 2350, the method 2300 includes combining the optical output signal with a second reference signal (e.g., the second reference signal 143) to generate an optical logic output (e.g., the optical logic output 177) corresponding to an output logic state. In some embodiments, the method 2300 includes performing, based at least on the resonator, one of operations: AND, OR, NOT, NAND, NOR, XOR, XNOR, flip flop, modulation, demodulation, etc., with the optical logic input serving as an input and the optical logic output serving as an output. For example, the optical logic output corresponding to the output logic state can represent a result of a logic operation. In some embodiments, the method 2300 includes coupling the optical logic output with an input or an output of a second resonator.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

What is claimed is:

1. An optical circuit comprising:

a resonator including a nonlinear optical material having intensity-dependent absorption, an input, and an output;

an optical input path coupled to the input of the resonator and configured to provide an optical logic input;

an optical reference path coherently coupled to the input and the output of the resonator and configured to provide a first reference signal coupled to the optical input path and a second reference signal; and an optical output path coupled to the output of the resonator and configured to receive the second reference signal, wherein the resonator is configured to receive a combined version of the optical logic input and the first reference signal, and provide an optical output signal based on the optical logic input, the first reference signal, and an intensity threshold of the nonlinear optical material, wherein the optical output path is configured to provide an optical logic output based on the optical output signal and the second reference signal, the optical logic output corresponding to an output logic state, and wherein the coherent coupling of the optical reference path to the resonator is configured to provide optical gain.

2. The optical circuit of claim 1, further comprising:

a first optical coupler configured to combine the optical logic input with the first optical reference signal and generate an optical input signal coupled to the input of the resonator; and a second optical coupler configured to combine the optical output signal with the second reference signal to generate the optical logic output.

3. The optical circuit of claim 1, wherein the input of the resonator is configured to receive an optical input signal that includes the optical logic input and the first optical reference signal, and wherein the nonlinear optical material is configured to:

transmit the optical input signal as the optical output signal in response to the optical input signal exceeding the intensity threshold; and absorb the optical input signal to not transmit the optical output signal in response to the optical input signal being below the intensity threshold.

4. The optical circuit of claim 1, wherein the optical input path is operatively coupled with a plurality of logic inputs, and the optical logic input is generated based on the plurality of logic inputs.

5. The optical circuit of claim 4, wherein the plurality of logic inputs are optical signals, and at least one of the plurality of logic inputs is a substantially-zero input serving as a logic state.

6. The optical circuit of claim 1, wherein the resonator is one of: an optical cavity, an optical ring resonator, and a Fabry-Perot resonator.

7. The optical circuit of claim 1, wherein the nonlinear optical material is disposed on a top surface of the resonator or within a trench of the resonator and includes at least one of a multi-quantum well and quantum dots.

8. The optical circuit of claim 1, wherein the optical circuit is configured to perform one of operations: AND, OR, NOT, NAND, NOR, XOR, XNOR, flip flop, modulation, and demodulation with the optical input path serving as an input and the optical output path serving as an output, and wherein the output logic state is a result of the one of operations determined based on a phase or an amplitude of the optical logic output.

9. The optical circuit of claim 1, wherein the resonator is a first resonator, and the optical circuit further comprises a second resonator optically coupled with the first resonator in series or parallel.

10. The optical circuit of claim 1, further comprising a fanout component optically coupled to the output of the resonator and configured to provide the optical logic output to a plurality of fanout paths.

11. An optical logic circuit comprising:

an optical input path configured to provide an optical logic input;

a first optical coupler configured to combine the optical logic input with a first optical reference signal and generate an optical input signal;

an optical resonator configured to receive the optical input signal, and further configured to:

provide a first optical output signal in response to the optical input signal exceeding an intensity threshold, or provide a second optical output signal in response to the optical input signal being below the intensity threshold; and a second optical coupler configured to combine one of (i) the first optical output signal and (ii) the second optical output signal with a second reference signal to generate an optical logic output corresponding to (i) a first logic state associated with the first optical output signal or (ii) a second logic state associated with the second optical output signal, wherein each of the first optical reference signal and the second optical reference signal allows for interferometric gain.

12. The optical circuit of claim 11, wherein the optical resonator includes a nonlinear optical material configured to:

transmit the optical input signal to provide the first optical output signal in response to the optical input signal exceeding the intensity threshold; and absorb the optical input signal to provide the second optical output signal in response to the optical input signal being below the intensity threshold.

13. The optical circuit of claim 12, wherein the nonlinear optical material is disposed on a top surface of the optical resonator or within a trench of the optical resonator and includes at least one of a multi-quantum well and quantum dots.

14. The optical circuit of claim 11, wherein the optical input path is operatively coupled with a plurality of logic inputs, and the optical logic input is generated based on the plurality of logic inputs.

15. The optical circuit of claim 14, wherein the plurality of logic inputs are optical signals, and at least one of the plurality of logic inputs is a substantially-zero input serving as a logic state.

16. The optical circuit of claim 11, wherein the resonator is a first resonator, and the optical circuit further comprises a second resonator wherein an output of the first resonator is optically coupled with an input or an output of the second resonator.

17. The optical circuit of claim 11, further comprising a fanout component configured to provide the optical logic output to a plurality of fanout paths.

18. A method comprising:

providing an optical logic input generated based on a plurality of logic inputs;

combining the optical logic input with a first reference signal to generate an optical input signal;

receiving, by a resonator including a nonlinear optical material, the optical input signal;

providing, by the resonator, an optical output signal based on the optical input signal and an intensity threshold of the nonlinear optical material; and combining the optical output signal with a second reference signal to generate an optical logic output corresponding to an output logic state.

19. The method of claim 18, further comprising:

performing, based at least on the resonator, one of operations: AND, OR, NOT, NAND, NOR, XOR, XNOR, flip flop, modulation, and demodulation with the optical logic input serving as an input and the optical logic output serving as an output.

20. The method of claim 18, further comprising:

coupling the optical logic output with an input or an output of a second resonator.

* * * * *